(12) United States Patent
Kersting et al.

(10) Patent No.: US 12,277,970 B2
(45) Date of Patent: Apr. 15, 2025

(54) COMPENSATING NON-IDEALITY OF A NEUROMORPHIC MEMORY DEVICE

(71) Applicant: INTERNATIONAL BUSINESS MACHINES CORPORATION, Armonk, NY (US)

(72) Inventors: Benedikt Kersting, Lüdinghausen (DE); Athanasios Vasilopoulos, Kilchberg (CH); Manuel Le Gallo-Bourdeau, Horgen (CH); Julian Röttger Büchel, Zurich (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 18/337,214

(22) Filed: Jun. 19, 2023

(65) Prior Publication Data

US 2024/0420762 A1 Dec. 19, 2024

(51) Int. Cl.
*G11C 11/54* (2006.01)
*G11C 13/00* (2006.01)

(52) U.S. Cl.
CPC .......... *G11C 13/0069* (2013.01); *G11C 11/54* (2013.01); *G11C 13/0026* (2013.01); *G11C 13/0028* (2013.01)

(58) Field of Classification Search
CPC ...................................................... G11C 11/54
USPC .......................................................... 365/148
See application file for complete search history.

(56) References Cited

U.S. PATENT DOCUMENTS

| 10,079,058 | B1 | 9/2018 | Eleftheriou |
| 10,452,472 | B1 | 10/2019 | Graves |
| 2019/0018917 | A1 | 1/2019 | Dai |
| 2019/0189174 | A1 | 6/2019 | Hu |

(Continued)

OTHER PUBLICATIONS

Huang, et al., "Efficient and Optimized Methods for Alleviating the Impacts of IR-Drop and Fault in RRAM Based Neural Computing Systems," IEEE Journal of the Electron Devices Society [article], Aug. 2015, 8 pages, vol. 14, No. 8, DOI:10.1109/JEDS.2021.3093478, Retrieved from the Internet: <URL: https://www.researchgate.net/publication/352845361_Efficient_and_Optimized_Methods_for_Alleviating_the_Impacts_of_IR-Drop_and_Fault_in_RRAM_Based_Neural_Computing_Systems>.

(Continued)

*Primary Examiner* — Anthan Tran
(74) *Attorney, Agent, or Firm* — Teddi E. Maranzano

(57) ABSTRACT

The present disclosure relates to a method for compensating non-ideality of a neuromorphic memory device. The neuromorphic memory device comprising a crossbar array of wordlines and bitlines. The crossbar array comprises a block of wordline and bitline segments, wherein memory elements of the block are programmed to represent array values. The device is configured for applying a set of inputs to the initial wordlines for performing dot products. The method comprises: performing at least one of: wordline expansion or bitline expansion of the block. The set of inputs may be applied to the initial wordlines of the expanded block and in case the bitline expansion is performed an additional input may be applied to the additional wordlines of the expanded block. The currents flowing in the bitlines of the expanded block may be measured. The dot products may be determined using the measured currents.

20 Claims, 12 Drawing Sheets

(56) References Cited

U.S. PATENT DOCUMENTS

2020/0327287 A1   10/2020  Piveteau
2021/0073317 A1*   3/2021  Dazzi ...................... G06N 3/02
2022/0398036 A1*  12/2022  Sun ...................... G06F 3/0616

OTHER PUBLICATIONS

Khaddam-Aljameh, et al., "HERMES-Core—A 1.59-TOPS/mm2 PCM on 14-nm CMOS In-Memory Compute Core Using 300-ps/LSB Linearized CCO-Based ADCs," IEEE Journal of Solid-State Circuits, Apr. 2022, 9 pages, vol. 57, Issue 4, IEEE, DOI: 10.1109/JSSC.2022.3140414, Retrieved from the Internet: <URL: https://ieeexplore.ieee.org/document/9696185>.

Papandreou, et al., "Programming algorithms for multilevel phase-change memory," 2011 IEEE International Symposium of Circuits and Systems (ISCAS), IEEE Xplore [online], 2011 [accessed on Nov. 26, 2021], pp. 329-332, DOI: 10.1109/ISCAS.2011.5937569, Retrieved from the Internet: <URL: https://ieeexplore.ieee.org/document/5937569>.

\* cited by examiner

COMPENSATING NON-IDEALITY OF A NEUROMORPHIC MEMORY DEVICE

BACKGROUND

The present invention relates to the field of digital computer systems, and more specifically, to a method for compensating non-ideality of a neuromorphic memory device.

Hardware acceleration enables the use of computer hardware specially made to perform some functions more efficiently than is possible in software running on a general-purpose CPU. For example, an operation can be computed in application-specific hardware designed to compute the operation faster than on a general-purpose computer processor. However, there is a need to improve computation of multitude of those operations.

SUMMARY

Various embodiments provide a method for compensating non-ideality of a neuromorphic memory device, a computer program product and computer system as described by the subject matter of the independent claims. Advantageous embodiments are described in the dependent claims. Embodiments of the present invention can be freely combined with each other if they are not mutually exclusive.

In one aspect, the invention relates to a method for compensating non-ideality of a neuromorphic memory device, the neuromorphic memory device comprising a crossbar array, the crossbar array comprising wordlines and bitlines and resistive memory elements coupled between the wordlines and the bitlines at junctions formed by the wordlines and the bitlines, the crossbar array comprising an initial block of one or more wordline segments of respective wordlines, referred to as initial wordlines, and one or more bitline segments of respective bitlines, referred to as initial bitlines, wherein the resistive memory elements of the initial block are programmed to represent array values; the device being configured for applying a set of inputs to the initial wordlines for performing dot products. The input applied to the wordline may be referred to as encoding input. The method comprises:
- performing at least one of: wordline expansion or bitline expansion of the initial block resulting in an expanded block of resistive memory elements, wherein the wordline expansion comprises adding to each wordline segment of the initial block one or more memory elements of the respective initial wordline resulting in an expanded wordline segment, the adding comprising programming the added memory elements to enable a predefined total conductance in the expanded worldline segment; wherein the bitline expansion comprises adding to each bitline segment of the initial block one or more memory elements of the respective initial bitline resulting in an expanded bitline segment, the adding comprising programming the added memory elements to generate a predefined offset current in the expanded bitline segment;
- applying the set of inputs to the initial wordlines of the expanded block and in case the bitline expansion is performed further applying an additional input to the additional wordlines of the expanded block;
- measuring the currents flowing in the bitlines of the expanded block;
- determining the dot products using the measured currents.

In one aspect the invention relates to a computer program product comprising a computer-readable storage medium having computer-readable program code embodied therewith, the computer-readable program code configured to implement the method of the above embodiment.

In one aspect the invention relates to a computer system configured to implement the method of the above embodiment.

BRIEF DESCRIPTION OF THE DRAWINGS

In the following embodiments of the invention are explained in greater detail, by way of example only, making reference to the drawings in which.

DETAILED DESCRIPTION

Figure 1A:
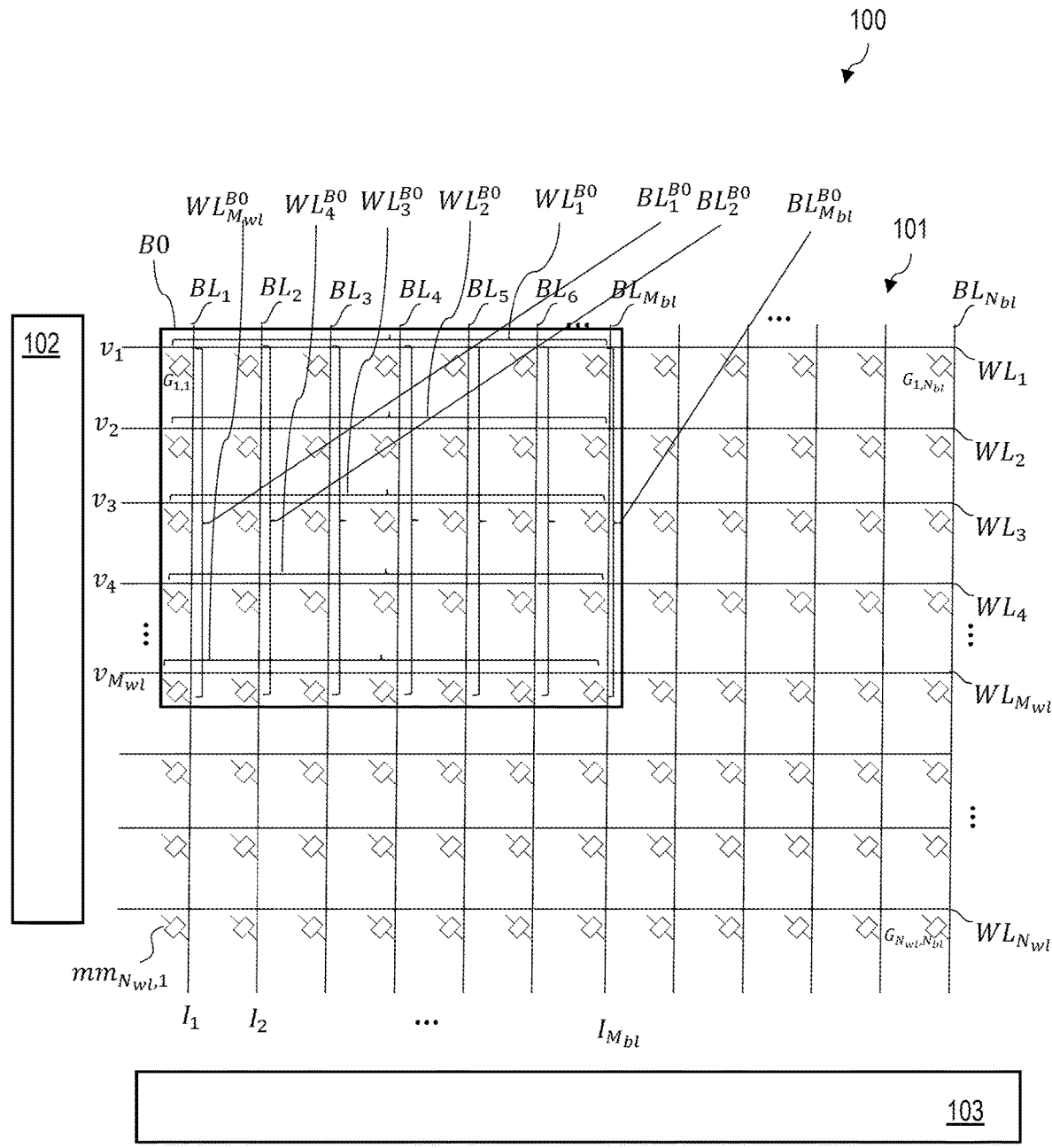
FIG. 1A is a block diagram of a neuromorphic memory device in accordance with an example of the present subject matter.

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The dot product may be the sum of the products of the corresponding entries of the two sequences of numbers or two vectors. The dot products may, for example, be involved in different computations such as matrix-vector multiplications (MVM). The matrix-vector multiplication may be the main computation used in machine learning. For example, deep neural networks involve a matrix-vector multiplication, in which a vector of neuron excitations is to be multiplied by a matrix of weights, generating a new vector of neuron excitations for the next layer. The present subject matter may enable an efficient computation of matrix-vector multiplication of a matrix A and vector x using the neuromorphic memory device. The matrix A may, for example, represent weights of a deep neural network. In the following, the matrix-vector multiplication of the matrix A and vector x may be referred to as task TASK. The neuromorphic memory device may be a device or memory device comprising memory elements. In particular, the matrix-vector multiplication of a matrix A and vector x may be performed through the crossbar array of memory elements by representing each matrix element with the conductance of the corresponding memory element of the crossbar array, wherein the multiplication of the matrix A and vector x may be performed by inputting voltages representing the vector values x to the crossbar array and the resulting currents are indicative of the product of A and x. A memory element may be a resistive memory element. The memory element may, for example, be one of a phase change memory (PCM), a metal-oxide resistive RAM, a conductive bridge RAM and a magnetic RAM. In another example, the memory element may be a charge-based memory element such as SRAM and Flash (NOR and NAND) elements. The non-ideality may refer to effects that cause a deviation from ideal computations in the neuromorphic memory device.

In order to support a variety of applications e.g., a variety of networks, the size of the crossbar array may have to be provided large enough. However, this may result in only a subset of devices are used in most of applications. The present subject matter may make use of this feature in order to further improve the computed dot products. In one example, the crossbar array (named first type crossbar array) may comprise a number $N_{wl}$ of wordlines and a number $N_{bl}$ of bitlines. The wordlines may be referred to as $WL_1, \ldots, WL_{N_{wl}}$ respectively. The bitlines may be referred to as $BL_1, \ldots, BL_{N_{bl}}$ respectively. The numbers $N_{bl}$ and $N_{wl}$ are integers higher than or equal to two, $N_{bl} \geq 2$ and $N_{wl} \geq 2$. A block (named initial block B0) of the crossbar array may be used to represent the elements of the matrix (e.g., A) of the matrix-vector multiplication. For example, the initial block B0 may comprise a number $M_{bl}$ of bitline segments of respective $M_{bl}$ bitlines and a number $M_{wl}$ of wordline segments of respective $M_{wl}$ wordlines. The numbers $M_{bl}$ and $M_{wl}$ are integers higher than or equal to one, $M_{bl} \geq 1$ and $M_{wl} \geq 1$. The wordline segments may be referred to as $WL_1^{B0}, \ldots, WL_{M_{wl}}^{B0}$ respectively, where the superscript B0 refers to the initial block. The bitline segments may be referred to as $BL_1^{B0}, \ldots, BL_{M_{bl}}^{B0}$ respectively. The memory elements of the crossbar array may be referred to as $mm_{i,j}$, where i is an index that represents the wordline and it is an integer between 1 and $N_{wl}$ and j is an index that represents the bitline and it is an integer between 1 and $N_{bl}$.

For example, the initial block may comprise a number $M_{wl} \times M_{bl}$ of memory elements while the crossbar array comprises a larger number $N_{wl} \times N_{bl}$ of memory elements. Thus, the crossbar array may comprise unused memory elements e.g., unused memories may be the memory elements which are not used to perform the task TASK. The unused memory element may be a memory element that is programmed to a RESET state or to the smallest conductance state. For example, a wordline $WL_i$ may comprise a wordline segment $WL_i^{B0}$ and a number $N_{bl}-M_{bl}$ of unused memory elements $mm_{i,M_{bl}+1}, mm_{i,N_{bl}}$. The initial block of $M_{wl} \times M_{bl}$ memory elements may be programmed to conductances $G_{ij}$ that represent the array values $A_{ij}$ respectively. In order to perform the dot products of the task TASK, a set of $M_{wl}$ inputs $v_1, \ldots, v_{M_{wl}}$ may be applied to the wordlines $WL_1, \ldots, WL_{M_{wl}}$ respectively, wherein the set of inputs $v_1, \ldots, v_{M_{wl}}$ represent the values of the input vector x (of the task TASK) respectively. The set of inputs may be provided using an encoding scheme. The input applied to the wordline may thus be referred to as encoding input. The encoding scheme may include voltage encoding or time encoding. In voltage encoding, the voltage amplitude is modulated according to the digital input, while the pulse width is modulated according to the digital inputs in time encoding. For example, the set of encoding inputs may be respectively a set of pulse widths for a same pulse amplitude. Alternatively, the set of encoding inputs may be respectively a set of pulse amplitudes for a same pulse width. For example, each value of the input vector x may be represented by a specific pulse amplitude or pulse duration.

The present subject matter may make use of the unused memory elements in order to compensate the non-ideality of the neuromorphic memory device. For that, a wordline expansion and/or bitline expansion of the initial block B0 may be performed. This may result in an expanded block of memory elements. For example, memory elements in series with the initial block memory elements may be programmed to high conductance states to compensate circuit non-idealities and improve the compute accuracy.

The wordline expansion may be performed by adding to each wordline segment $WL_i^{B0}$ of the initial block B0 one or more unused memory elements of the respective initial wordline $WL_i$ resulting in an expanded wordline segment $WL_i^{B1}$, where the superscript B1 refers to the expanded block. The added memory elements of the expanded worldline segment $WL_i^{B1}$ may be programmed to enable a predefined target total conductance in the expanded worldline segment $WL_i^{B1}$. For example, each expanded worldline segment $WL_i^{B1}$ of the expanded block B1 may have the same target total conductance. The wordline expansion may enable to control the total conductance of each wordline which in turn enables to control the discharge tail duration and/or equalize the discharge tail between the wordlines. For example, the wordline expansion may enable to reduce and equalize the "PWM offset" by programming unused memory elements on the wordline such, that the summed conductance across a wordline is constant for all wordlines. This may enable that most of the wordline capacitance is discharged into the unused ADCs connected to the added memory elements.

The bitline expansion may be performed by adding to each bitline segment $BL_j^{B0}$ of the initial block B0 one or more memory elements of the respective initial bitline $BL_j$ resulting in an expanded bitline segment $BL_j^{B1}$. The added memory elements of the expanded bitline segment $BL_j^{B1}$ may be programmed to generate a predefined offset current in the expanded bitline segment $BL_j^{B1}$. In one example, the same number of memory elements is added to each bitline segment $BL_j^{B0}$. In case the expanded block is obtained using only the bitline expansion, the encoding inputs to be applied to the wordlines of the expanded block may be provided in accordance with the time encoding scheme or the voltage encoding scheme. However, if the expanded block is obtained using the wordline expansion or using the wordline expansion and the bitline expansion, the encoding inputs to be applied to the wordlines of the expanded block may be provided in accordance with the time encoding scheme e.g., the wordline expansion may be compatible with time encoding.

For ease of the description, the index i is used to represent the wordline in the crossbar array or the wordline in the initial block or the wordline in the expanded block. For example, the index i represents the wordline segment $WL_i^{B0}$ (which implies that it represents the corresponding whole wordline $WL_i$). Thus, the index i may be an integer number between 1 and $N_{wl}$, if it refers to the crossbar, or between 1 and $M_{wl}$ if it refers to the initial block or between 1 and $K_{wl}$ if it refers to the expanded block. Similarly, the index j is used to represent the bitline in the crossbar array or the bitline in the initial block or the bitline in the expanded block. For example, the index j represents the bitline segment (which implies that it represents the corresponding whole bitline) $BL_j^{B0}$. Thus, the index j may be an integer number between 1 and $N_{bl}$ if it refers to the crossbar, or between 1 and $M_{bl}$ in the initial block or between 1 and $K_{bl}$ in the expanded block.

The expanded block B1 may comprise a maximum number $K_{bl}$ of bitline segments and a number $K_{wl}$ of wordline segments, where $K_{bl} \geq M_{bl}$ and $K_{wl} \geq M_{wl}$. In case the wordline expansion is performed, the number $K_{bl}$ of bitline segments of the expanded block is higher than the number $M_{bl}$ of bitline segments of the initial block. In case the bitline expansion is performed, the number $K_{wl}$ of wordline segments of the extended block is higher than the number $M_{wl}$ of wordline segments of the initial block. Thus, the number $$P_{WL_i^{B0}}$$

of memory elements added to each wordline segment $WL_i^{B0}$ may be smaller than or equal to $$K_{bl} - M_{bl}, P_{WL_i^{B0}} \leq K_{bl} - M_{bl}, \text{ e.g.,}$$

$$P_{WL_i^{B0}} = K_{bl} - M_{bl}.$$

This is because the number of memory elements added to two different wordline segments may not necessarily be the same. The number $P_{BL_j^{B0}}$ of memory elements added to each bitline segment $BL_j^{B0}$ may be equal to $$K_{wl} - M_{wl}, P_{BL_j^{B0}} = K_{wl} - M_{wl}.$$

After applying the wordline expansion and/or bitline expansion, the set of encoding inputs $v_1, \ldots, v_{M_{wl}}$ may be applied to the wordlines $WL_1, \ldots, WL_{M_{wl}}$ respectively. And in case the bitline expansion is performed, an additional encoding input ($v_{read}$) may be applied to each wordline of the additional $K_{wl} - M_{wl}$ wordlines $WL_{M_{wl}+1} \ldots WL_{K_{wl}}$ of the expanded block B1. In one example, the time encoding may be used in case the wordline expansion is performed. That is, if the wordline expansion and/or the bitline expansion is performed, each encoding input that is applied to the crossbar may be provided as a pulse duration. In another example, the voltage encoding may be used in case the bitline expansion is performed. That is, if only the bitline expansion is performed, each encoding input that is applied to the crossbar may be provided as a pulse amplitude. This may be advantageous as the bitline expansion may be compatible with time and voltage input encoding, whereas wordline expansion may be compatible with time encoding.

The currents flowing in the $K_{bl}$ bitlines of the expanded block B1 may be measured and the dot products of the task TASK may be determined using the measured currents. The measurements may, for example, be performed using an analog to digital converter (ADC).

For example, the current following in each bitline of the expanded block B1 may be defined as follows: $I_j = v_1 \cdot G_{1,j} + v_2 \cdot G_{2,j} + v_3 \cdot G_{3,j} + \ldots + v_{M_{wl}} \cdot G_{M_{wl},j} + \ldots + v_{read} \cdot G_{K_{wl},j}$.

The present subject matter may be advantageous as it may prevent the offsets and nonlinearity which may be caused by the intrinsic structure of the array circuit. For example, both features can be attributed to the discharging of the wordline (capacitance) into an ADC. The discharging of the wordline capacitance may be equivalent to a certain input signal duration (e.g., a PWM offset). The present subject matter may be used for many applications that use only a fraction of the memory crossbar. The expansion schemes may mitigate the error introduced by capacitive discharging of the bitline and increase the read current signals to improve the signal to noise ratio and sample a more linear region of the ADC transfer curve.

According to one example, the target total conductance may be predetermined. The target total conductance may be referred to as $G_{WLtarget}$. For example, a set of conductances (named set of target conductances) may be provided. For each target conductance of the set of target conductances the following may be performed. All memory elements of the crossbar array may be programmed to the target conductance. For each encoding input of a set of R encoding inputs (e.g., R=128), a sweeping of the encoding input to the crossbar array may be performed so that $N_{wl}$ wordline conductances ($G_{WL_i}$) may be measured for the $N_{wl}$ wordlines respectively. For example, for a given wordline i, only the encoding input $v_i$ is applied while a zero encoding input may be applied to the other wordlines. Thus, the measured currents may be provided as follows: $I_1 = v_i \cdot G_{i,1}$, $I_2 = v_i \cdot G_{i,2} \ldots I_{N_{bl}} = v_i \cdot G_{i,N_{bl}}$, where $\Sigma_{j=1}^{N_{bl}} I_j = \Sigma_{j=1}^{N_{bl}} v_i \cdot G_{i,j} = v_i \cdot \Sigma_{j=1}^{N_{bl}} G_{i,j}$. The first term $\Sigma_{j=1}^{N_{bl}} I_j$ of the equality may provided as an ADC count which represents/is proportional to the total conductance $G_{WL_i} = \Sigma_{j=1}^{N_{bl}} G_{i,j}$ of the wordline i. One (e.g., the largest one) of the $N_{wl}$ measured wordline conductances may be selected. This may result in a set of R selected wordline conductances associated with the set of R encoding inputs respectively. Thus, for each target conductance, a set of R selected wordline conductances may be provided. For each target conductance, the corresponding set of R selected wordline conductances may be analyzed (e.g., by fitting) as function of the set of encoding inputs for determining an offset. In addition, the largest wordline conductance of the set of R selected wordline conductances may be identified. The predefined target total conductance $G_{WLtarget}$ may thus be the largest wordline conductance associated with a selected desired offset.

In order to determine the number $$P_{WL_i^{B0}}$$

of memory elements to be added to the wordline segment $WL_i^{B0}$ the following may be performed. A maximum allowed conductance $G_{max}$ that can be used to program the memory element may be determined. The conductance $$G_{WL_i^{B0}}$$

of the current wordline segment $WL_i^{B0}$ may be determined. Based on the target total conductance $G_{WLtarget}$, the number $$P_{WL_i^{B0}}$$

of the memory elements to be added to the current wordline segment $WL_i^{B0}$ may be equal to $$\frac{G_{WLtarget} - G_{WL_i^{B0}}}{G_{max}}, P_{WL_i^{B0}} = \frac{G_{WLtarget} - G_{WL_i^{B0}}}{G_{max}}.$$

The $$P_{WL_i^{B0}}$$

additional memory elements may, for example, be programmed to the conductance $G_{max}$.

In one example, the offset current $I_{offset}$ may be predetermined as follows. An ADC transfer current curve of the neuromorphic memory device may be built. The current amplitude ($I_{linear}$) of the curve at which the second derivative of the ADC transfer curve converges may be determined. The current amplitude $I_{linear}$ may be used for determining the offset current. For example, $I_{offset}=1.5 \times I_{linear}$.

In order to determine the number $$P_{BL_j^{B0}}$$

of memory elements to be added to the bitline segment $BL_j^{B0}$ the following may be performed. The maximum allowed conductance $G_{max}$ that can be used to program the memory element may be determined. Knowing the offset current $I_{offset}$ and the additional encoding input $v_{read}$, the number $$P_{BL_j^{B0}}$$

may be defined by the following equation $$\frac{I_{offset}}{v_{read} \times G_{max}} = P_{BL_j^{B0}}.$$

The $$P_{BL_j^{B0}}$$

additional memory elements may, for example, be programmed to the conductance $G_{max}$. For example, an offset current of 250 ADC counts may be achieved by programming 20 memory elements on the bitline to 12.5 ADC counts.

During the measurement of the currents, the offset current may cancel out or be subtracted from the measured currents. In order to perform the subtraction, the offset current (as generated by the crossbar array) may be estimated such that it can be subtracted from the measured current. The estimating of the offset current may be performed by applying the additional encoding input $v_{read}$ to the additional wordlines $WL_{M_{wl}+1} \ldots WL_{K_{wl}}$ of the expanded block B1 without applying encoding inputs to the remaining wordlines, and measuring the flowing currents in the bitlines of the expanded block B1 in order to determine the offset current.

The bitline expansion may be performed using the first type crossbar array or a second type crossbar array. The second type crossbar array may be provided in order to deal with negative values of an array. For that, the second type crossbar array may comprise a number $N_{wl}$ of wordlines and an even number $2 \times N_{bl}$ of bitlines. For ease of the description, the number of bitlines is chosen as the double of the number of bitlines of the first type crossbar array. The second type crossbar array may be used to represent the array A comprising negative values and optionally positive values. The bitlines $BL_1, \ldots, BL_{2 \times N_{bl}}$ may comprise a number $N_{bl}$ of pairs of consecutive bitlines, namely the pairs $(BL_1, BL_2) \ldots (BL_{2 \times N_{bl}-1}, BL_{2 \times N_{bl}})$. The pairs are not overlapping since they do not share bitlines. Each pair comprises a positive bitline a negative bitline. The memory elements that belong to the positive bitline may be referred to as positive memory elements. The memory elements that belong to the negative bitline may be referred to as negative memory elements.

The difference between the first type and second type crossbar arrays may be described as follows. With the first type crossbar array, each column of the matrix A (of the task TASK) may be represented by conductances of one respective bitline of the crossbar array while with the second type crossbar array, each column of the matrix A (of the task TASK) may be represented by conductances of one respective pair of bitlines of the crossbar array. If an array value $A_{ij}$ is negative, then the corresponding negative memory element $mm_{i,2 \times j}$ may be programmed to represent the array value $A_{ij}$. However, if the array value $A_{ij}$ is positive, the corresponding positive memory element $mm_{i,2 \times j-1}$ may be programmed to represent the array value $A_{ij}$.

In one example, the $$P_{BL_j^{B0}}$$

additional memory elements may be added as positive memory elements to the positive bitline segment $BL_{2 \times j-1}^{B0}$ and as negative memory elements to the negative bitline segment $BL_{2\times j}^{B0}$. The additional memory elements may be programmed to an identical conductance state, e.g., $G_{max}$. Thus, the positive and negative current amplitudes are identical and may cancel out. If the encoding input to the additional wordlines $WL_{M_{wl}+1} \ldots WL_{K_{wl}}$ of the expanded block B1 is positive, the negative memory elements generate a negative current and the positive memory elements generate a positive current. By programming the same conductance to positive and negative memory elements, the signals may cancel out. That is, the bitline expansion may increase the positive and negative current amplitude by identical magnitude. These two signal offsets cancel out.

In one example, the $$P_{BL_j^{B0}}$$

additional memory elements may be added as positive memory elements to the positive bitline segment $BL_{2\times j-1}^{B0}$ or added as negative memory elements to the negative bitline segment $BL_{2\times j}^{B0}$. For example, an offset current of 250 ADC counts may be achieved by programming 20 memory elements (of one polarity) on each bitline to a conductance that induces 12.5 ADC counts. Thus, only memory elements of one polarity are used for expanding and programmed to a high conductance. In this example, the offset current may not cancel out as in the previous example. To overcome this, one first solution may consist of estimating the offset current (as generated by the crossbar array) such that it can be subtracted from the measured current. The estimating of the offset current may be performed by applying the additional encoding input $v_{read}$ to the additional wordlines $WL_{M_{wl}+1} \ldots WL_{K_{wl}}$ of the expanded block B1 without applying encoding inputs to the remaining wordlines, and measuring the flowing currents in the bitlines of the expanded block in order to determine the offset current. For example, the offset current generated by these additional memory elements may be measured by applying only the additional encoding input $v_{read}$ to the additional wordlines $WL_{M_{wl}+1} \ldots WL_{K_{wl}}$ of the expanded block B1; where the set of encoding inputs $v_1 \ldots v_{M_{wl}}$ which are inputs in the initial wordlines $WL_1 \ldots WL_{M_{wl}}$ are set to zero. When the actual computation is executed, the offset current may be corrected digitally by subtracting it from the measured ADC signal. One second solution may consist of using the additional encoding input $v_{read}$ as a positive value for half of the additional wordlines $WL_{M_{wl}+1} \ldots WL_{K_{wl}}$ of the expanded block B1 and as a negative value for the other half. This may enable to compensate the offset current. For example, if the positive memory elements are used for expanding, one half of the memory elements may receive a negative input $v_{read}$ to generate a negative current, and the other half may receive a positive input $v_{read}$ to generate a positive current of the same amplitude.

Hence, the bitline expansion may introduce an offset current signal to boost the read current signals of the MVM operation. This can improve the signal to noise ratio and shift the measurement to a more linear range of the ADC.

FIG. 1A depicts a neuromorphic memory device 100 in accordance with an example of the present subject matter. The neuromorphic memory device 100 a crossbar array of memory elements 101 and peripheral circuits. The peripheral circuits may comprise a signal input circuitry 102. The signal input circuitry 102 may, for example, comprise Digital to Analog Converters (DACs). The signal input circuitry 102 may enable to perform an encoding scheme in order to apply digital input to the crossbar 101. The encoding scheme may include voltage encoding or time encoding. In voltage encoding, the voltage amplitude is modulated according to the digital input, while the pulse width is modulated according to the digital inputs in time encoding. The peripheral circuits may comprise at the output of the crossbar 101 a current read circuitry 103. The current read circuitry 103 may comprise Analog to Digital Converter (ADC) that is shared across the columns of the crossbar 101. The current read circuitry 103 may convert analog current to voltage, which may then be passed through the ADC.

FIG. 1A shows a diagram of a two-dimensional (2D) crossbar array 101 that may for example perform a matrix-vector multiplication. Crossbar array 101 is formed from a set of conductive row wires $BL_1, \ldots, BL_{N_{bl}}$ and a set of conductive column wires $WL_1, \ldots, WL_{N_{wl}}$. The conductive column wires may be referred to as bitlines $BL_1, \ldots, BL_{N_{bl}}$ and conductive row wires $WL_1, \ldots, WL_{N_{wl}}$ may be referred to as wordlines. The intersections between the set of wordlines $WL_1, \ldots, WL_{N_{wl}}$ and the set of bitlines $BL_1, \ldots, BL_{N_{bl}}$ are separated by memristors each having its own adjustable/updateable resistive weight or conductance, $G_{i,j}$ respectively where $i=1, \ldots, N_{wl}$, and $j=1 \ldots, N_{bl}$. For a simplified illustration, not all references are shown in the Figures e.g., only one memristor $mm_{N_{wl},1}$ is labeled and few conductances are labeled. However, the skilled person in the art would understand the references of the remaining elements such as conductances and memory elements based on the used matrix indexing. FIG. 1A provides an example with memristors for exemplification purpose and it is not limited to. For example, the junctions between the set of wordlines $WL_1, \ldots, WL_{N_{wl}}$ and the set of bitlines $BL_1, \ldots, BL_{N_{bl}}$ may comprise charge-based memory elements instead of memristors. The memory elements of the crossbar array 101 may be referred to as $mm_{i,j}$. The index i may represent the wordline and it is an integer between 1 and $N_{wl}$ and j is an index that represents the bitline and it is an integer between 1 and $N_{bl}$.

An initial block B0 of the crossbar array 100 may be used to perform the dot products of a matrix-vector multiplication. In particular, the initial block B0 may enable the computation of the multiplication of a vector x with the matrix A. For example, the initial block B0 may comprise a number $M_{bl}$ of bitline segments of respective $M_{bl}$ bitlines and a number $M_{wl}$ of wordline segments of respective $M_{wl}$ wordlines. The numbers $M_{bl}$ and $M_{wl}$ are integers higher than or equal to one, $M_{bl} \geq 1$ and $M_{wl} \geq 1$. The numbers $M_{bl}$ and $M_{wl}$ may be provided in accordance with the size of the matrix A which is $M_{wl} \times M_{bl}$ and the size of the vector x which is $M_{wl}$. The bitline segments may be referred to as $BL_1^{B0}, \ldots, BL_{M_{bl}}^{B0}$ respectively. The wordline segments may be referred to as $WL_1^{B0}, \ldots, WL_{M_{wl}}^{B0}$ respectively.

In order to enable the computation of the multiplication of the vector x with the matrix A, the memory elements of the initial block B0 may be programmed to conductances that represent array values of the matrix A respectively. The items $A_{ij}$ of the matrix A may be mapped onto corresponding conductances of the initial block B0 as follows:

$$A_{ij} = \frac{A_{max}}{G_{max}} G_{ij},$$

where $G_{max}$ is the maximum conductance to which the memory elements of the crossbar array 101 may be programmed and $A_{max}$ may be chosen depending on the magnitude of matrix A. In addition, encoding inputs $v_1, \ldots, v_{M_{wl}}$ that represent the array values of the vector x may be applied to the wordlines $WL_1, \ldots, WL_{N_{wl}}$ respectively. Each bitline $BL_j$ sums the currents along the particular bitline $BL_j$. For example, as shown in FIG. 1A, the current $I_2$ generated by bitline $BL_2$ is according to the equation: $I_2=v_1 \cdot G_{2,1}+v_2 \cdot G_{2,2}+v_3 \cdot G_{2,3}+ \ldots +v_{M_{wl}} \cdot G_{2,M_{wl}}$. Thus, the crossbar array 101 computes the matrix-vector multiplication by multiplying the values stored in the memristors by the row wire inputs, which are defined by encoding inputs. Accordingly, the multiplication may be performed locally at each memristor of array 101 using the memristor itself plus the relevant row or column wire of array 101.

Figure 1B:
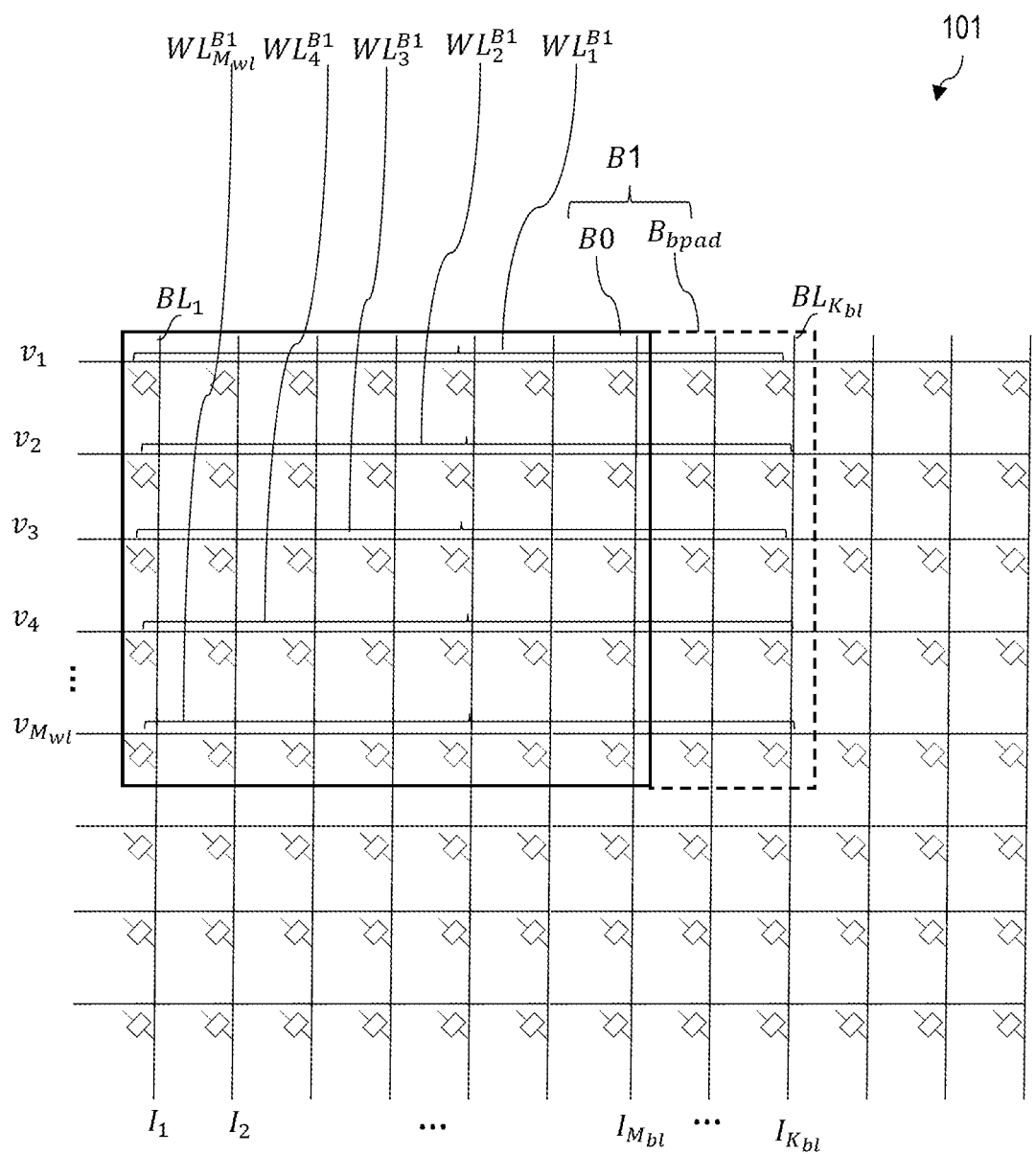
FIG. 1B is a block diagram of a crossbar array of memory elements in accordance with an example of the present subject matter.

FIG. 1B shows the status of the crossbar array 101 after applying the wordline expansion in accordance with an example of the present subject matter. As shown in FIG. 1B, the expanded block B1 may comprise the initial block B0 expanded with a padded block $B_{bpad}$. After the wordline expansion is performed, the encoding inputs are provided in accordance with the time encoding scheme e.g., the wordline expansion may be compatible with time encoding.

The wordline expansion may be performed by adding to each wordline segment $WL_i^{B0}$ of the initial block B0 one or more unused memory elements of the respective initial wordline $WL_i$ resulting in an expanded wordline segment $WL_i^{B1}$. The expanded block B1 may comprise a maximum number $K_{bl}$ of bitline segments, where $K_{bl} \geq M_{bl}$. The number $K_{bl}$ of bitline segments of the expanded block B1 is higher than the number $M_{bl}$ of bitline segments of the initial block B0. The number $$P_{WL_i^{B0}}$$

of memory elements added to each wordline segment $WL_i^{B0}$ may be smaller than or equal to $K_{bl}-M_{bl}$, $P_{WL_i^{B0}} \leq K_{bl}-M_{bl}$. This inequality is due to the fact that the number of memory elements that can be added to two different wordline segments may not necessarily be the same, where $K_{bl}-M_{bl}$ is the maximum number of memory elements that is added to a wordline segment.

Figure 1C:
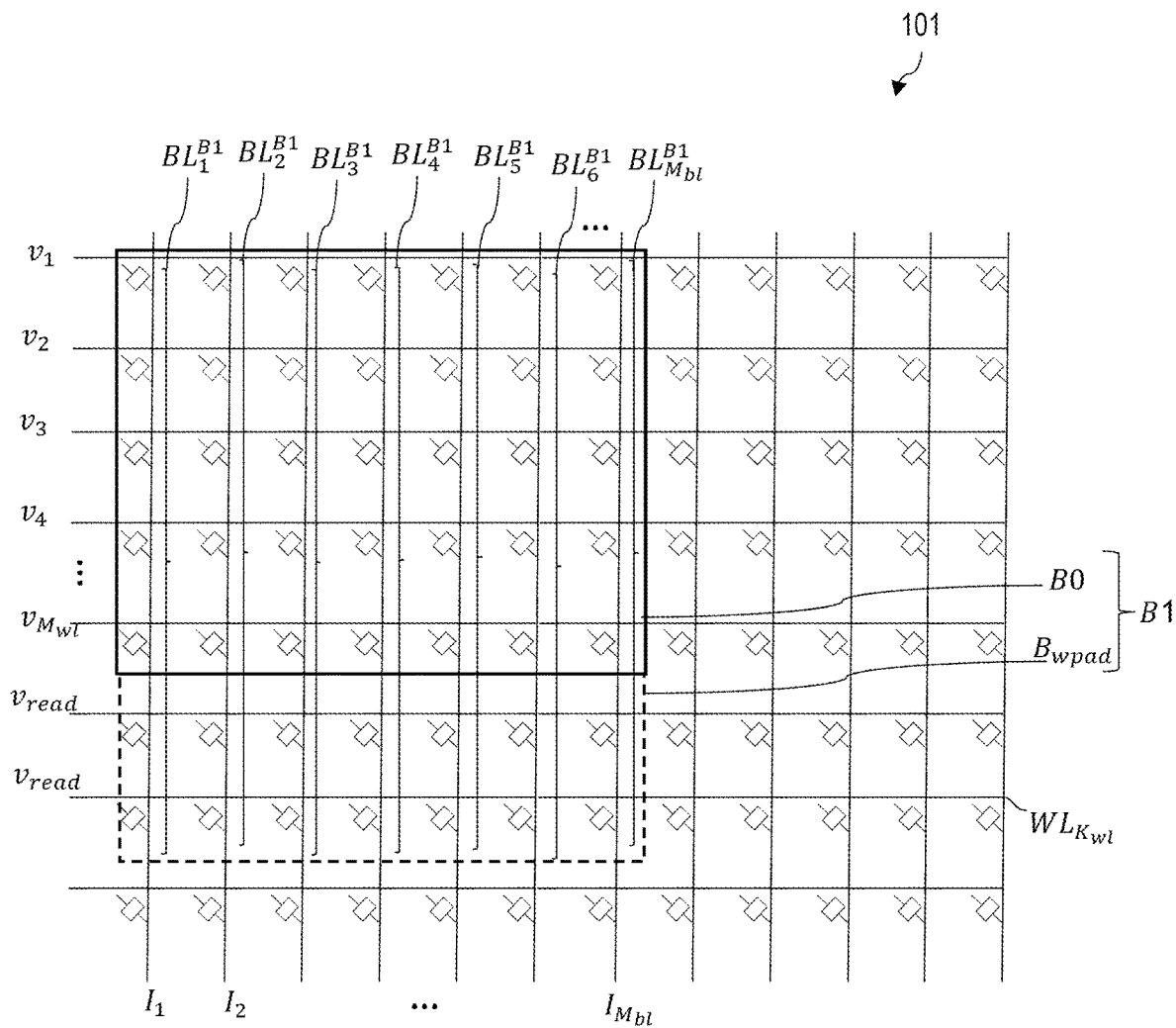
FIG. 1C is a block diagram of a crossbar array of memory elements in accordance with an example of the present subject matter.

FIG. 1C shows the status of the crossbar array 101 after applying the bitline expansion in accordance with an example of the present subject matter. As shown in FIG. 1C, the expanded block B1 may comprise the initial block B0 expanded with a padded block $B_{wpad}$. In case only the bitline expansion is performed, the encoding inputs may be provided in accordance with the time encoding scheme or the voltage encoding scheme.

The bitline expansion may be performed by adding to each bitline segment $BL_j^{B0}$ of the initial block one or more memory elements of the respective initial bitline $BL_j$ resulting in an expanded bitline segment $BL_j^{B1}$. The expanded block B1 may comprise a maximum number $K_{wl}$ of wordline segments, where $K_{wl} \geq M_{wl}$. The number $K_{wl}$ of wordline segments of the expanded block B1 is higher than the number $M_{wl}$ of wordline segments of the initial block. Thus, the number $P_{BL_j^{B0}}$ of memory elements added to each bitline segment $BL_j^{B0}$ may be equal to $$K_{bl}-M_{bl}, P_{BL_j^{B0}} = K_{bl}-M_{bl}.$$

Figure 1D:
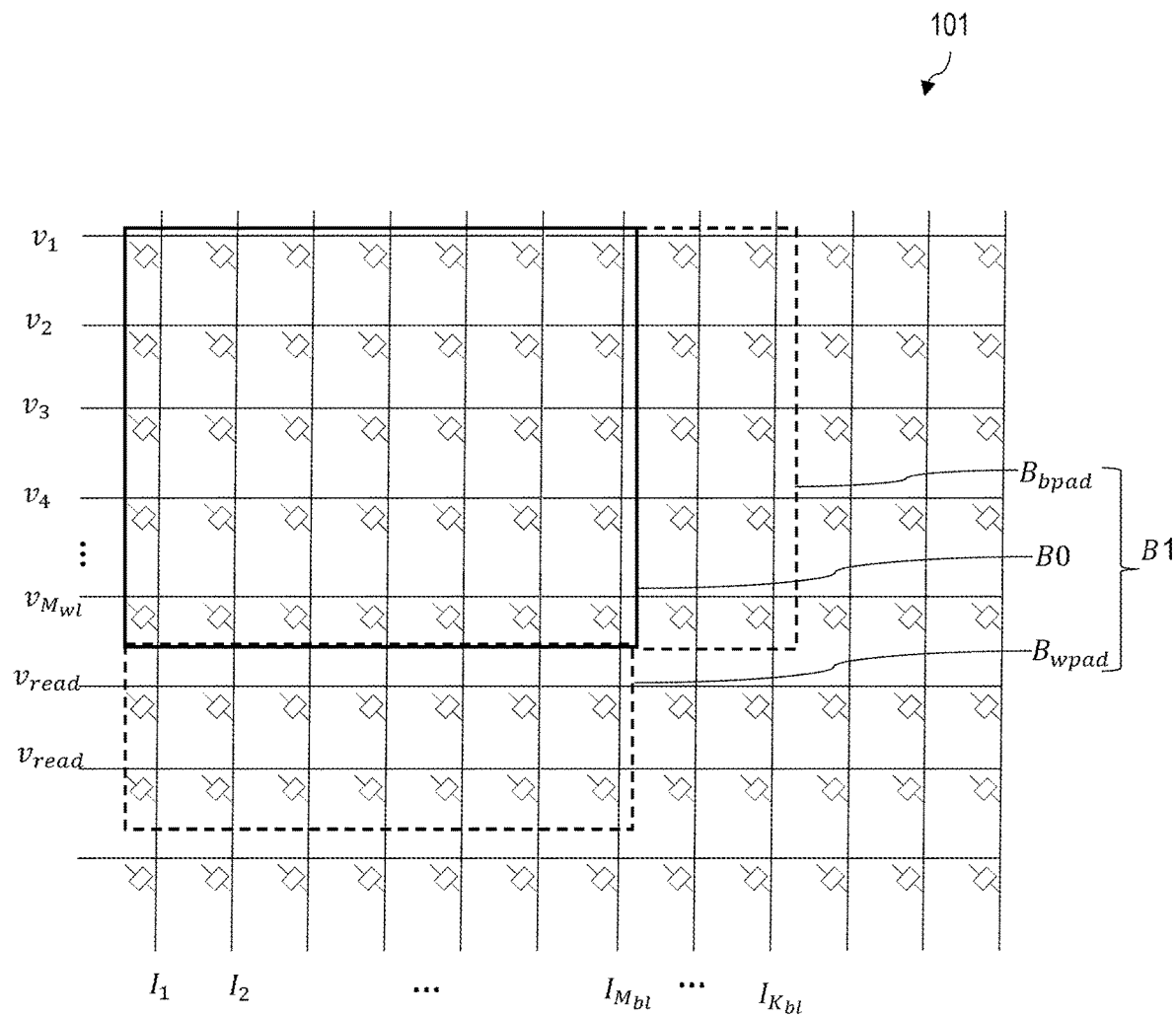
FIG. 1D is a block diagram of a crossbar array of memory elements in accordance with an example of the present subject matter.

FIG. 1D shows the status of the crossbar array 101 after applying the bitline expansion in accordance with an example of the present subject matter. As shown in FIG. 1D, the expanded block B1 may comprise the initial block B0 expanded with both padded block $B_{wpad}$ and padded block $B_{bpad}$.

Figure 2:
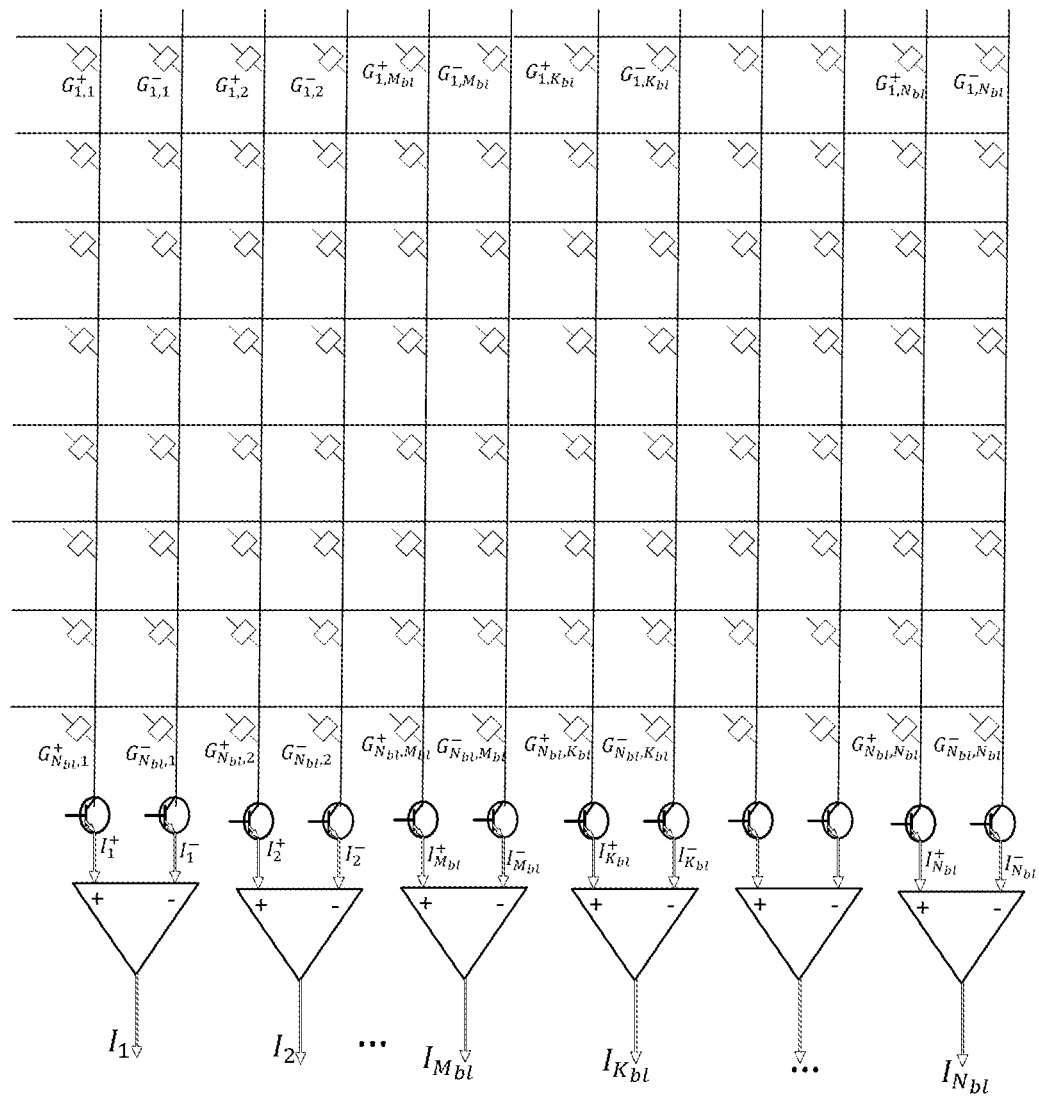
FIG. 2 is a block diagram of a neuromorphic memory device in accordance with an example of the present subject matter.

FIG. 2 depicts a diagram of an alternative implementation of the crossbar array in accordance with an example of the present subject matter.

The crossbar array 200 may comprise a number $N_{wl}$ of wordlines and an even number $2 \times N_{bl}$ of crossing bitlines. The crossbar array 200 may be used to represent the array A comprising negative values and optionally positive values. The bitlines $BL_1, \ldots, BL_{2 \times N_{bl}}$ may comprise a number $N_{bl}$ of pairs of consecutive bitlines, namely the pairs ($BL_1$, $BL_2$) ... ($BL_{2 \times N_{bl}-1}$, $BL_{2 \times N_{bl}}$). Each pair may comprise a positive bitline and corresponding negative bitline. The memory elements that belong to the positive bitline may be referred to as positive memory elements. The memory elements that belong to the negative bitline may be referred to as negative memory elements. If an array value $A_{ij}$ is negative, then the negative memory element $mm_{i,2 \times j}$ may be programmed to represent the array value $A_{ij}$. However, if the array value $A_{ij}$ is positive, the positive memory element $mm_{i,2 \times j-1}$ may be programmed to represent the array value $A_{ij}$.

Current through a single memristor memory element is a product of the encoding input applied across it and its conductance value. Since conductance may always be positive, a single pair of bitlines together representing signed values in the array and their currents are subtracted to get the net current of that column as given by the following equation $I_j=I_j^+-I_j^-$, where $I_j^+=\Sigma_{i=1:M_{wl}} G_{i,j}^+ \times v_i$ and $I_j^-=\Sigma_{i=1:M_{wl}} G_{i,j}^- \times v_i$. $G^+$ may encode a positive part of a weight, and $G^-$ may encode a negative part of a weight. For example, $G_{i,j}^+=G_{i,j}$ and $G_{i,j}^-=0$ if the corresponding matrix element $A_{i,j}$ is positive, and $G_{i,j}^-=G_{i,j}$ and $G_{i,j}^+=0$ if the corresponding matrix element $A_{i,j}$ is negative.

Figure 3:
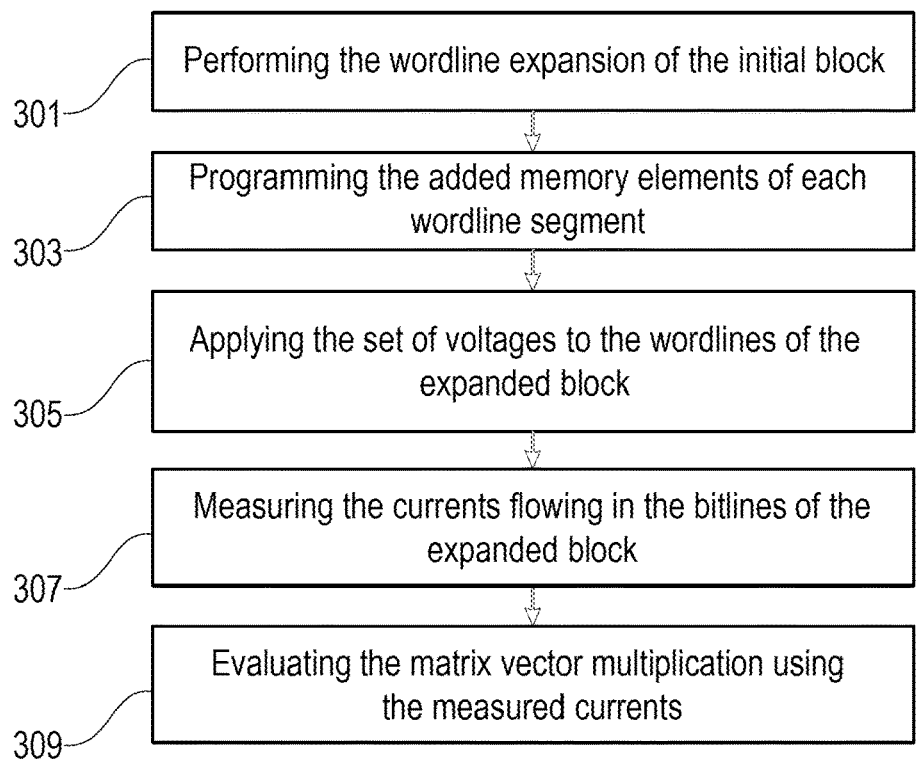
FIG. 3 is a flowchart of a method for compensating non-ideality of a neuromorphic memory device in accordance with an example of the present subject matter.

FIG. 3 is a flowchart of a method for compensating non-ideality of a neuromorphic memory device 100. For the purpose of explanation, the method described in FIG. 3 may be implemented in the system illustrated in FIG. 1A, but is not limited to this implementation.

The wordline expansion of the initial block B0 may be performed in step 301. This may result in an expanded block B1 of memory elements as shown, for example, in FIG. 1B. The wordline expansion may be performed by adding to each wordline segment $WL_i^{B0}$ of the initial block B0 a number $$P_{WL_i^{B0}}$$

of memory elements of the respective initial wordline $WL_i$ resulting in an expanded wordline segment $WL_i^{B1}$, where i may be between 1 and the number of wordline segments $M_{wl}$. For example, the wordline segment $WL_1^{B0}$ of the initial block B0 may be expanded with a number $$P_{WL_1^{B0}}$$

of memory elements of the respective initial wordline $WL_1$ resulting in an expanded wordline segment $WL_1^{B1}$. However, the number of memory elements to be added to the wordline segments may or may not be the same. The added number of memory elements may, for example, depend on the sum of conductances in each wordline segment. The addition of memory elements may result in adding one or more bitlines to the initial block B0. The highest number of memory elements that is added to a wordline segment may be referred to as the maximum number and may result in the expanded block B1 comprising $K_{bl}$ bitline segments. That is, the maximum number of added memory elements may be defined as the difference $K_{bl}-M_{bl}$ between the numbers of bitline segments in the initial block B0 and the expanded block B1 e.g., if the highest number of memory elements is added to the first wordline segment $WL_1^{B0}$, this may indicate that the number $$P_{WL_1^{B0}} = K_{bl} - M_{bl}$$

of added memory elements in the first wordline segment is the maximum number. As shown in FIG. 1B, the wordline expansion of the initial block B0 may result in adding the block $B_{bpad}$ of bitline segments to the initial block B0. That is, the number of wordlines of the initial block B0 did not change.

The $$P_{WL_i^{B0}}$$

added memory elements to each wordline segment $WL_i^{B0}$ may be programmed in step 303 to enable a predefined target total conductance ($G_{WLtarget}$) in the expanded worldline segment $WL_i^{B1}$. The memory elements in the padded block $B_{bpad}$ may be programmed so that the total conductance in each expanded worldline segment $WL_i^{B1}$ is the total target conductance. In case the number of memory elements $$P_{WL_i^{B0}}$$

of a wordline segment $WL_i^{B0}$ is smaller than the maximum number max=$K_{bl}-M_{bl}$ by a number X $$\left(\text{i.e., } X = P_{WL_i^{B0}} - \max\right),$$

then the last X memory elements of the expanded wordline segment $WL_i^{B1}$ may not be programmed.

The set of encoding inputs $v_1, \ldots, v_{M_{wl}}$ that represent the array values of the vector x may be applied in step 305 to the wordlines $WL_1, \ldots, WL_{M_{wl}}$ of the expanded block B1 respectively.

The currents $I_1, \ldots, I_{K_{bl}}$ flowing in the bitlines $BL_1, \ldots, BL_{K_{bl}}$ of the expanded block B1 respectively may be measured in step 307.

The matrix vector multiplication may be evaluated in step 309 using the measured currents $I_1, \ldots, I_{K_{bl}}$.

Figure 4:
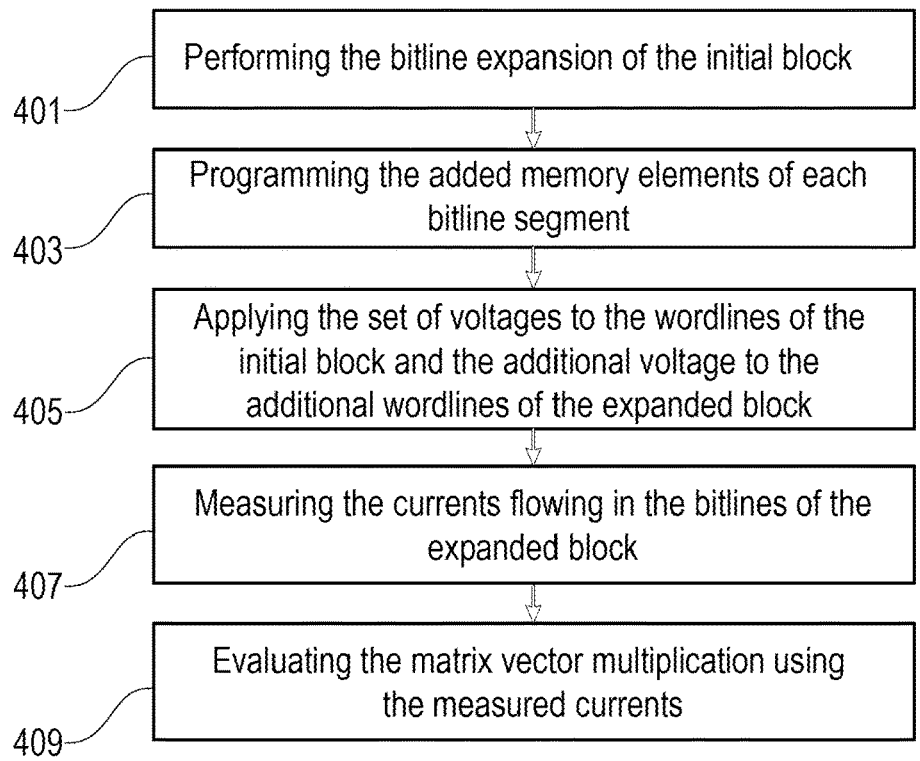
FIG. 4 is a flowchart of a method for compensating non-ideality of a neuromorphic memory device in accordance with an example of the present subject matter.

FIG. 4 is a flowchart of a method for compensating non-ideality of a neuromorphic memory device 100. For the purpose of explanation, the method described in FIG. 4 may be implemented in the system illustrated in FIG. 1A, but is not limited to this implementation.

The bitline expansion of the initial block B0 may be performed in step 401. This may result in an expanded block B1 of memory elements as shown, for example, in FIG. 1C. The bitline expansion may be performed by adding to each bitline segment $BL_j^{B0}$ of the initial block B0 a number $$P_{BL_j^{B0}}$$

of memory elements of the respective initial bitline $BL_j$ resulting in an expanded bitline segment $BL_j^{B1}$, where j may be between 1 and the number of bitline segments $M_{bl}$. For example, the bitline segment $BL_1^{B0}$ of the initial block B0 may be expanded with a number $$P_{BL_1^{B0}}$$

of memory elements of the respective initial bitline $BL_1$ resulting in an expanded wordline segment $BL_1^{B1}$. The number of memory elements to be added to the bitline segments may be the same in order to provide a constant current offset. The addition of memory elements may result in adding one or more wordlines to the initial block B0. The number of memory elements that is added to a bitline segment may be referred to as the number and may result in the expanded block B1 comprising $K_{wl}$ wordline segments. That is, the number of added memory elements may be defined as the difference $K_{wl}-M_{wl}$ between the numbers of wordline segments in the initial block B0 and the expanded block B1. As shown in FIG. 1C, the bitline expansion of the initial block B0 may result in padding the block $B_{wpad}$ of wordline segments to the initial block B0. That is, the number of bitlines of the initial block B0 did not change.

The $$P_{BL_j^{B0}}$$

added memory elements to each bitline segment $BL_j^{B0}$ may be programmed in step 403 to generate a predefined offset current in the expanded bitline segment $BL_j^{B1}$.

The set of encoding inputs $v_1, \ldots, v_{M_{wl}}$ that represent the array values of the vector x may be applied in step 405 to the wordlines $WL_1, \ldots, WL_{M_{wl}}$ of the initial block B0 respectively. In addition, an additional constant encoding input $v_{read}$ may be applied to each wordline segment of the padded block $B_{wpad}$.

The currents $I_1, \ldots, I_{M_{bl}}$ flowing in the bitlines $BL_1, \ldots, BL_{M_{bl}}$ of the expanded block B1 respectively may be measured in step 407.

The matrix vector multiplication may be evaluated in step 409 using the measured currents $I_1, \ldots, I_{M_{bl}}$.

Figure 5:
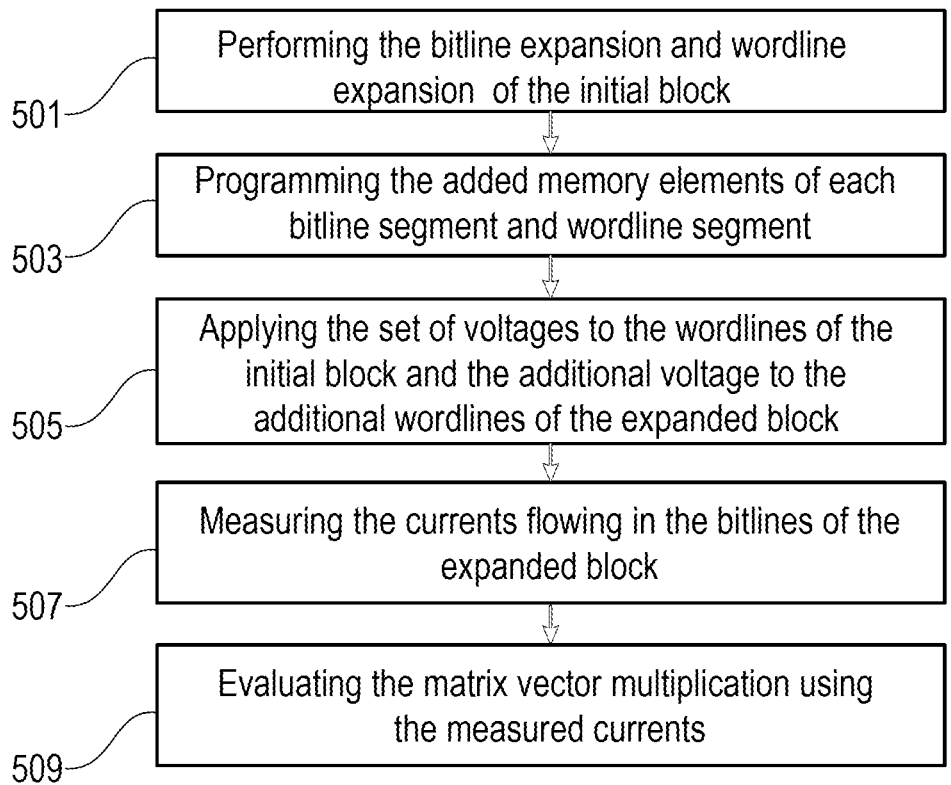
FIG. 5 is a flowchart of a method for compensating non-ideality of a neuromorphic memory device in accordance with an example of the present subject matter.

FIG. 5 is a flowchart of a method for compensating non-ideality of a neuromorphic memory device 100. For the purpose of explanation, the method described in FIG. 5 may be implemented in the system illustrated in FIG. 1A, but is not limited to this implementation.

Steps 301 and 401 of FIGS. 3 and 4 may be executed in step 501. This may result in the expanded block B1 as shown for example in FIG. 1D. Steps 303 and 403 of FIGS. 3 and 4 may be executed in step 503. Step 405 of FIG. 4 may be executed in step 505. The currents $I_1, \ldots, I_{bl}$ flowing in the bitlines $BL_1, \ldots, BL_{K_{bl}}$ of the expanded block B1 respectively may be measured in step 507. The matrix vector multiplication may be evaluated in step 509 using the measured currents $I_1, \ldots, I_{K_{bl}}$.

Figure 6:
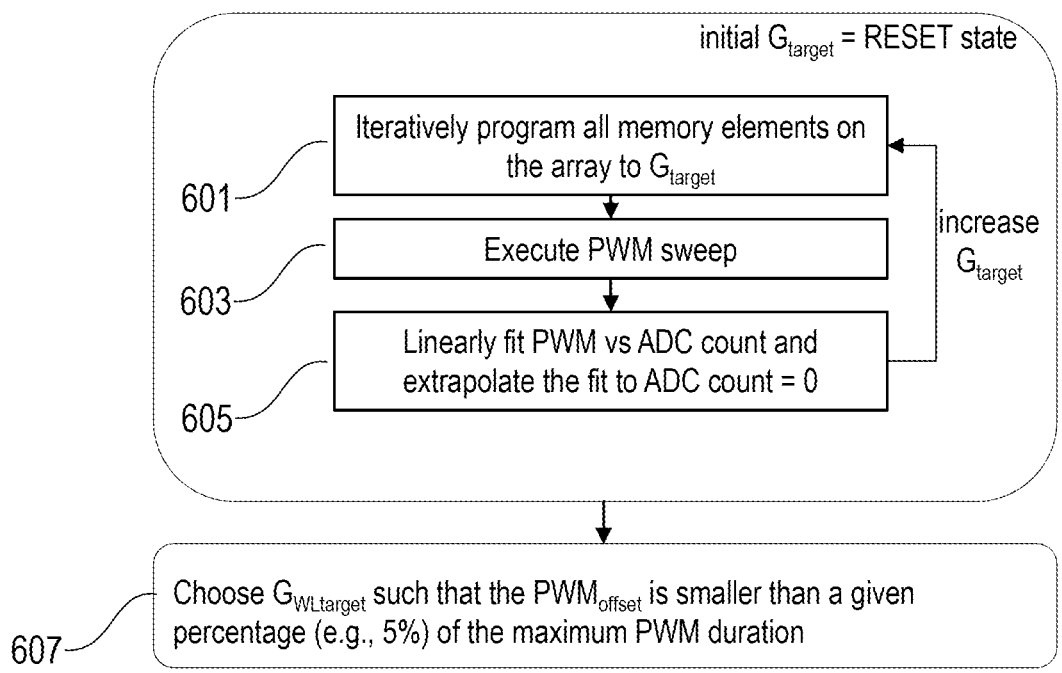
FIG. 6 is a flowchart of a method for determining the target total conductance in accordance with an example of the present subject matter.

FIG. 6 is a flowchart of a method for determining the target total conductance $G_{WLtarget}$ in accordance with an example of the present subject matter. For the purpose of explanation, the method described in FIG. 6 may be implemented in the system illustrated in FIG. 1A, but is not limited to this implementation.

Figure 7:
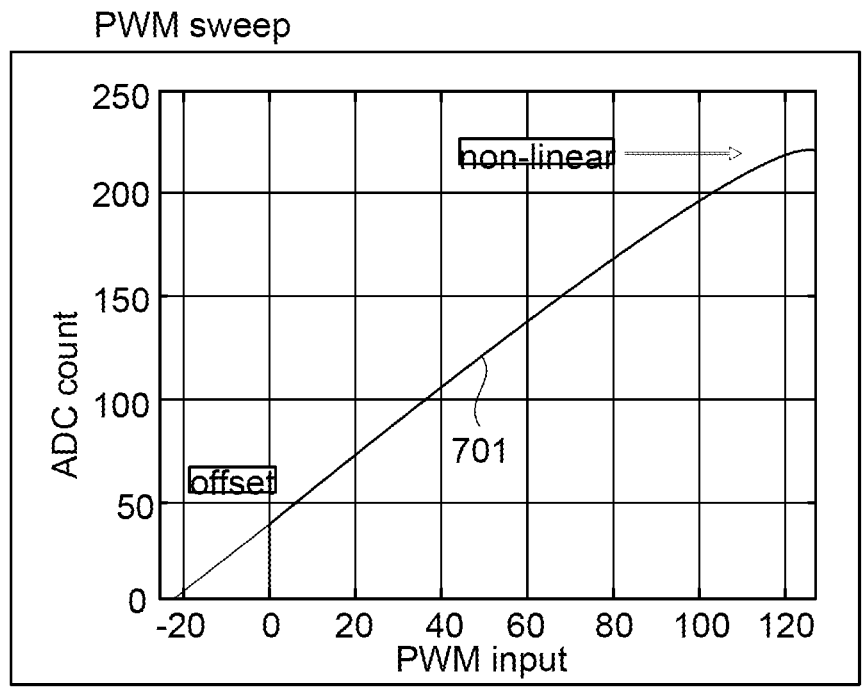
FIG. 7 is a curve of the determined conductances for a pulse width modulation (PWM) sweep.

All memory elements of the crossbar array 101 may iteratively be programmed in step 601 to a target conductance $G_{target}$. A PWM sweep may be executed in step 603. The PWM sweep may be performed as follows. A set of pulse widths may be provided e.g., 128 pulse widths may be defined (0 to 127). For each pulse width PWx of the provided 128 pulse widths the following may be performed. The pulse width PWx may sequentially be applied as input to each wordline of the crossbar array 101 and for each wordline to which the pulse width PWx is being applied, an ADC count that is induced by the total conductance of the wordline may be determined and the highest ADC count of the ADC counts of all wordlines to which the current pulse width PWx is applied may be selected. The PWM sweep may thus result in 128 selected ADC counts for the set of pulse widths respectively. This set of selected ADC counts is represented with the curve 701 of FIG. 7.

A linear fit of the curve 701 may be performed in step 605. The fit may, for example, be extrapolated to the zero value i.e., ADC count=0, in order to determine the PWM offset $PWM_{offset}$. In addition, the wordline conductance $G_{wl}$ may be defined as the conductance associated with largest ADC count in the PWM sweep (e.g., the largest ADC count in the curve 701 or the largest ADC count that results from the fit).

Thus, the execution of steps 601 to 605 may result in a pair of PWM offset and wordline conductance $G_{wordline}$, ($PWM_{offset}$, $G_{WL}$) associated with the current target conductance $G_{target}$. As indicated in FIG. 6, steps 601 to 605 may be repeated, wherein for each repetition a different (e.g., higher) target conductance $G_{target}$ may be used. The repetition may, for example, be performed to obtain at least three pairs ($PWM_{offset}$, $G_{WL}$), wherein the PWM offsets may differ by at least a factor 2.

Using the resulting pairs ($PWM_{offset}$, $G_{WL}$), the target total conductance may be chosen in step 607 by selecting one pair of the pairs e.g., the selected pair may have the PWM offset smaller than 5% of the maximum PWM duration; and the wordline conductance $G_{WL}$ of the selected pair may be the target total conductance $G_{WLtarget}$.

Figure 8:
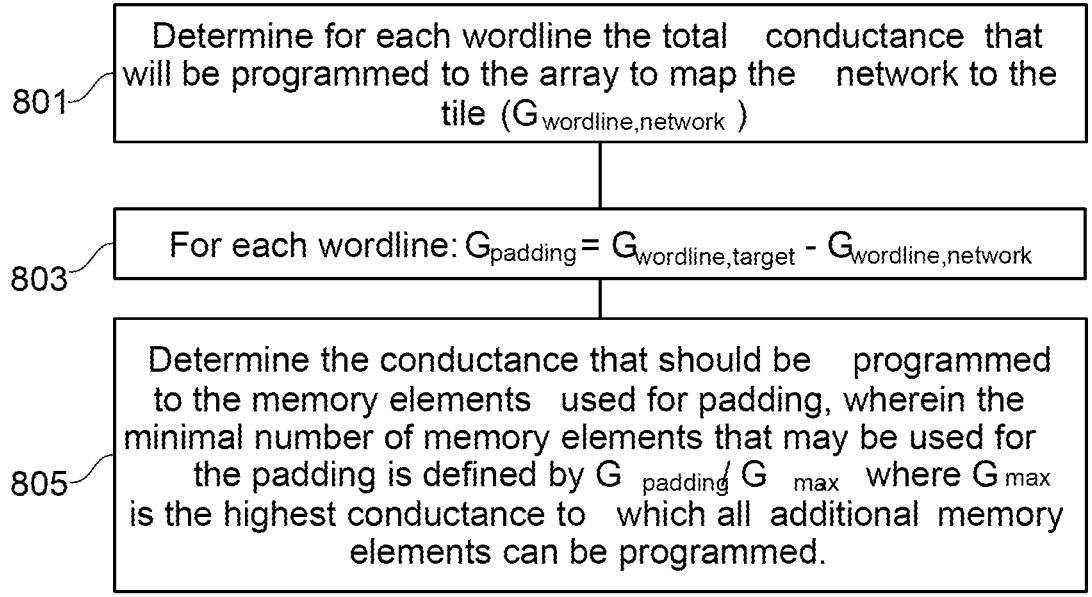
FIG. 8 is a flowchart of a method for determining the memory elements to be added for the wireline expansion in accordance with an example of the present subject matter.

FIG. 8 is a flowchart of a method for determining the memory elements to be added for the wireline expansion in accordance with an example of the present subject matter. For the purpose of explanation, the method described in FIG. 8 may be implemented in the system illustrated in FIG. 1A, but is not limited to this implementation.

It may be determined in step 801 for each wordline, the total conductance that will be programmed to the crossbar array 101 to map the network to the tile. The network may for example be represented by an initial block B0 of the crossbar array 101. The total conductance of a wordline segment $WL_i^{B0}$ may be referred to as $G_{WL_i,network}$ or $$G_{WL_i^{B0}}.$$

For each wordline segment $WL_i^{B0}$ of the initial block B0, the conductance $G_{padding}$ to be added to the wordline segment may be defined in step 803 using the target total conductance $G_{WLtarget}$ (e.g., as obtained from FIG. 6) as follows: $G_{padding} = G_{WLtarget} - G_{WL_i,network}$.

The conductance that should be programmed to the memory elements used for padding may be determined in step 805 using the determined padding conductance $G_{padding}$. For example, the minimal number of memory elements that may be used for the padding may be defined by the ration $$\frac{G_{padding}}{G_{max}},$$

where $G_{max}$ is the highest conductance to which all memory elements of the tile can be programmed. In addition, each of the additional memory elements may be programmed to a conductance $G_{cell}$ which may be defined as the ration of the padding conductance and the number of additional memory elements, $$G_{cell} = \frac{G_{padding}}{\text{number of additional memory elements}}.$$

Figure 9:
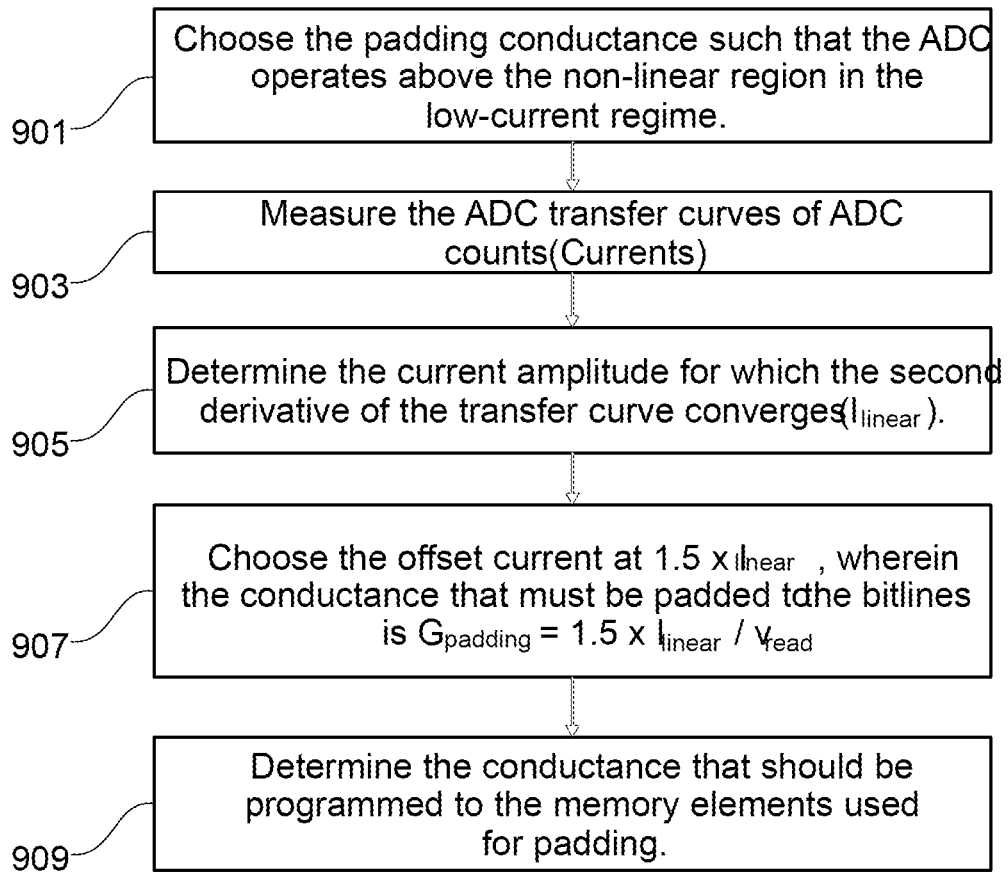
FIG. 9 is a flowchart of a method for determining the memory elements to be added for the bitline expansion in accordance with an example of the present subject matter.

FIG. 9 is a flowchart of a method for determining the memory elements to be added for the bitline expansion in accordance with an example of the present subject matter. For the purpose of explanation, the method described in FIG. 9 may be implemented in the system illustrated in FIG. 1A, but is not limited to this implementation.

Figure 10:
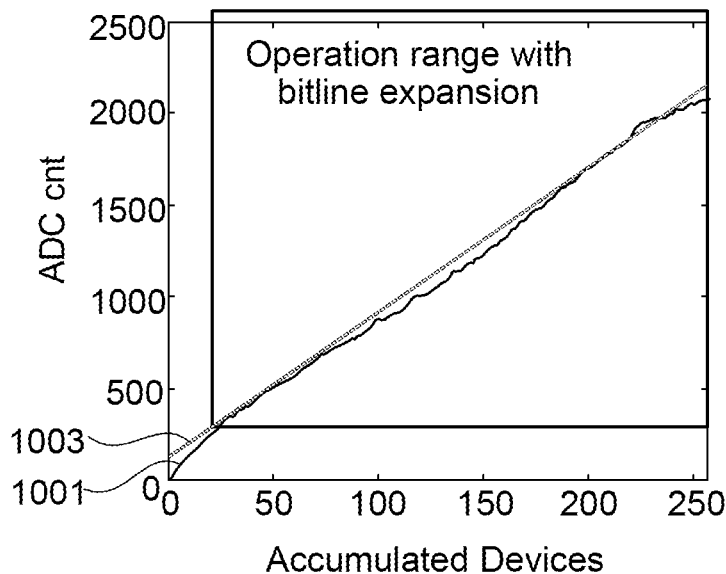
FIG. 10 is a curve of the determined conductances for a device sweep.

The padding conductance may be chosen in step 901 such that the ADC operates above the non-linear region in the low-current regime. The ADC transfer curve may be measured in step 903. FIG. 10 shows an example of the measured curve 1001 and a fitting model 1003 (dotted line) that represents the behaviour of the curve 1001.

The curve 1001 in FIG. 10 may be obtained as follows. All memory elements of the crossbar array 101 may be programmed to the same conductance. A sweep may then be performed as follows. The first read applies a "1" to the first memory element and "0" to all other memory elements. The second applies a "1" to the first two memory elements and "0" to all others and so on. In the last read a "1" is applied to all 256 memory elements. The curve of FIG. 10 shows an exemplary transfer curve 1001 of one ADC when performing this sweep. Applying a "1" means reading the memory element for 127 ns with a read bias of 200 mV. In this 127 ns a total charge of L flows into the ADC. This charge is translated into an ADC count The current amplitude ($I_{linear}$) for which the second derivative of the transfer curve 1001 converges may be determined in step 905.

The offset current may be chosen proportional to the current amplitude $I_{linear}$ e.g., $I_{offset} = 1.5 \times I_{linear}$ in step 907. This indicates that the conductance $G_{padding}$ that may be padded to the bitlines is $$G_{padding} = \frac{1.5 \times I_{linear}}{v_{read}}.$$

The conductance that should be programmed to the memory elements used for padding may be determined in step 909. In one example, it may be determined by considering that the minimal number of memory elements that may be used for the padding is defined by $$\frac{G_{padding}}{G_{max}}.$$

Alternatively, or additionally, it may be determined by considering that the minimal number of memory elements should be chosen such, that the total input sparsity=[1—(number of network inputs and number of offset inputs)/total number of inputs] is smaller than 80%. The number of offset inputs may be the number of added rows to the initial block. The number of network inputs may be the number of the rows in the initial block and the total number of inputs may be the number of rows in the crossbar array.

Figure 11:
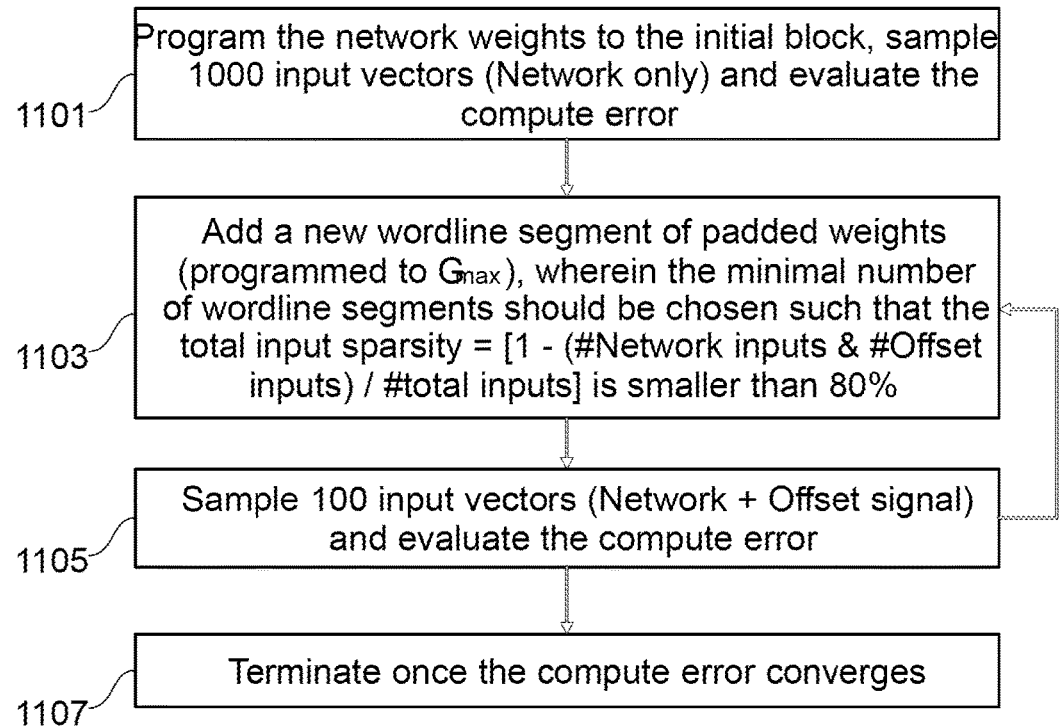
FIG. 11 is a flowchart of a method for determining the memory elements to be added for the bitline expansion in accordance with an example of the present subject matter.

FIG. 11 is a flowchart of a method for determining the memory elements to be added for the bitline expansion in accordance with an example of the present subject matter. For the purpose of explanation, the method described in FIG. 11 may be implemented in the system illustrated in FIG. 1A, but is not limited to this implementation.

In step 1101, the network weights may be programmed to the array represented by the initial block B0 and 1000 input vectors (e.g., Network only) may be sampled in order to evaluate the compute error. The compute error may, for example, be defined as follows:

$$error = \frac{\|y_{fp} - y_{exp}\|_2}{\|y_{fp}\|_2},$$

where $y_{fp}$ is the target result and $y_{exp}$ is the result obtained by the crossbar array.

In step 1103, a new row of padded weights (e.g., programmed to $G_{max}$) may be added to the initial block B0 in order to generate an offset signal. For example, the minimal number of memory elements should be chosen such that the total input sparsity is smaller than a threshold. The total input sparsity may be defined as $$\frac{1 - K_{wl}}{N_{wl}}$$

and the threshold may be 80%; that is, $$\frac{1 - K_{wl}}{N_{wl}} < 80\%.$$

$K_{wl}$ represents the number of voltage inputs of the network (the network which is encoded in the initial block) plus the number of additional wordlines of the expended block (e.g., which is used for obtaining the offset current).

A sample of 100 input vectors (for the Network and the offset signal) may be used in step 1105 to evaluate the compute error. Steps 1103 and 1105 may be repeated until the compute error converges. The method may terminate in step 1107 once the compute error converges.

Figure 12:
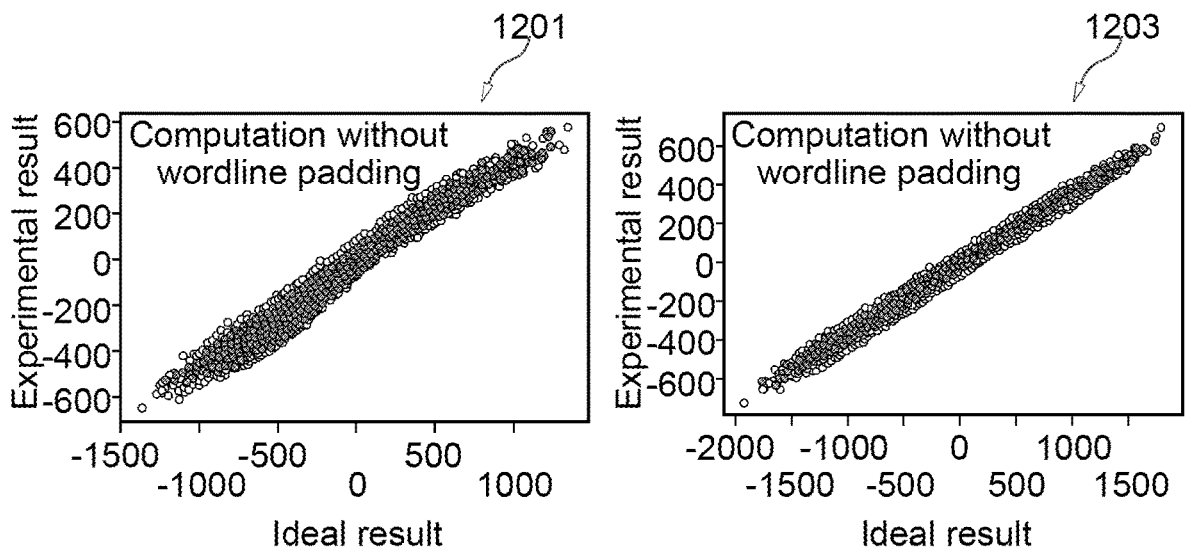
FIG. 12 is a plot showing the comparison between the ideal results and the experimental results obtained according to an example of the present subject matter.

FIG. 12 illustrates the performance of the measurement using an example implementation of the present subject matter. The plot 1201 shows the experiment results as function of the ideal results without wordline expansion. The plot 1203 shows the experiment results as function of the ideal results with wordline expansion. With wordline expansion the experiment matches better the ideal result (data spreads less and shows no curvature). This may enable a smaller compute error. In the present example implementation of FIG. 12, the crossbar comprises of two (sub) crossbars, one with memory elements that represent negative numbers and a second with memory elements that represent positive numbers. The subarrays are read individually. Thus, on both (sub) crossbars the wordline expansion is applied. On each wordline, 40 memory elements are programmed to 25 ADC counts and 1000 ADC counts are padded in total.

Figure 13A:
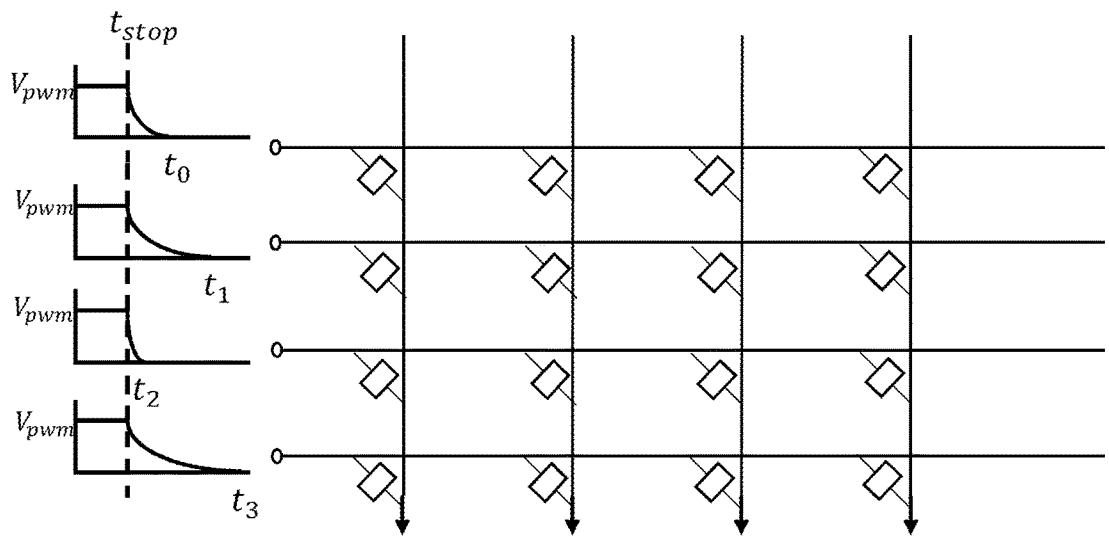
FIG. 13A is a diagram illustrating the discharging effect without applying the wordline expansion.

FIG. 13A illustrates the discharging effect before applying the wordline expansion. Each wordline of the crossbar array may receive an encoding input which may be a pulse having a fixed amplitude and a respective duration that ends at $t_{stop}$. Ideally, the input should be zero at time $t_{stop}$ so that only the square voltage pulses can be applied. However, due to the design of the circuit it may not be possible to pull the voltage level immediately to zero, due to the presence of the discharging of the wordline capacitance (RC discharge).

Wordline voltages may discharge differently after the stop time $t_{stop}$ following their active pulse. The discharge tail may represent a PWM offset. As shown in FIG. 13A, the discharge tail of each wordline may last a different time period depending on the total conductance of the wordline. For example, the discharge tails may last the periods $[t_{stop}, t_1]$, $[t_{stop}, t_2]$ and $[t_{stop}, t_3]$. The discharge may produce partial currents at the output of the crossbar array. Produced partial currents may have the same (current-time) I-T characteristic as the (voltage-time) V-T characteristic of the wordlines. ADCs at the output of the crossbar may integrate these differences, producing a strong, non-linear error. The wordline expansion may solve this.

Figure 13B:
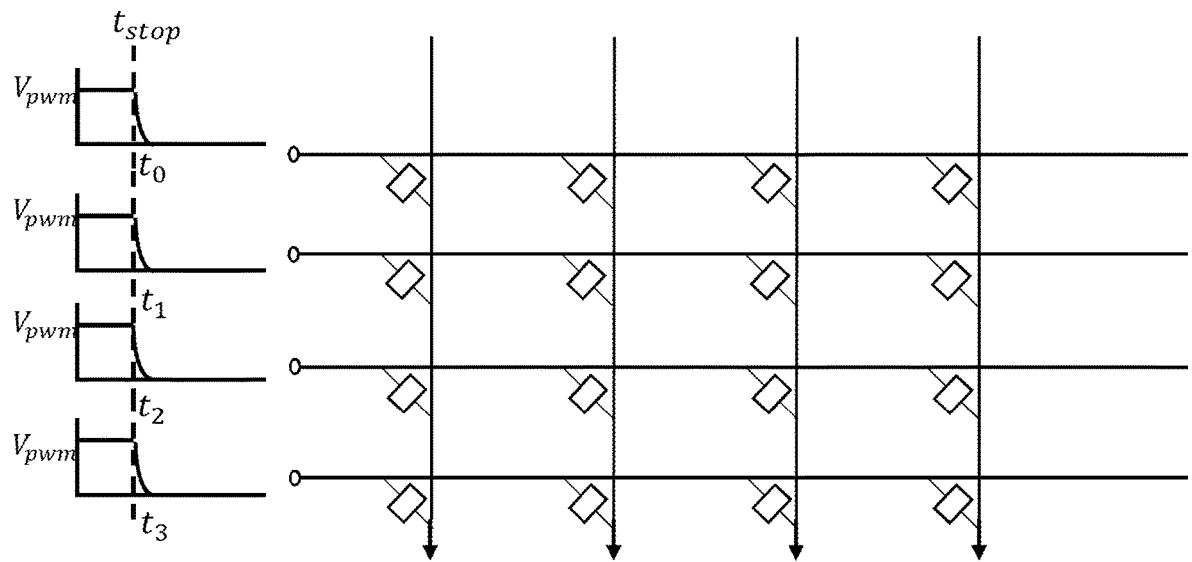
FIG. 13B is a diagram illustrating the discharging effect after applying the wordline expansion.

FIG. 13B illustrates the discharging effect after applying the wordline expansion. The wordline expansion may control the total conductance of each wordline which in turn enables to control the discharge tail duration and/or equalize the discharge tail between the wordlines. For example, the total conductance of the memory elements connected to each expanded wordline segment of the expanded block may be equalized (e.g., the summed conductance of the memory elements sharing a wordline is 100 uS for each wordline). Thus, the RC time constant of all wordlines may be identical. With the wordline extension, the total conductance/resistance may, for example, be identical for all wordlines. Thus, they may all have the same RC time-constant and show the same RC discharging. Input voltages and thus produced currents may have similar and short discharging duration. The effect on the measurement may be significantly lower than the uncompensated case of FIG. 13A. FIG. 13B indicates that the wordline expansion may enable to reduce and equalize the "PWM offset" by programming unused memory elements on the wordline such that the summed conductance across a wordline is constant for all wordlines. This may enable that most of the wordline capacitance is discharged into the unused ADCs connected to the added memory elements.

Computing environment 1800 contains an example of an environment for the execution of at least some of the computer code involved in performing the inventive methods, such as a code for compensating non-ideality of a neuromorphic memory device 1900. In addition to block 1900, computing environment 1800 includes, for example, computer 1801, wide area network (WAN) 1802, end user device (EUD) 1803, remote server 1804, public cloud 1805, and private cloud 1806. In this embodiment, computer 1801 includes processor set 1810 (including processing circuitry 1820 and cache 1821), communication fabric 1811, volatile memory 1812, persistent storage 1813 (including operating system 1822 and block 1900, as identified above), peripheral device set 1814 (including user interface (UI) device set 1823, storage 1824, and Internet of Things (IoT) sensor set 1825), and network module 1815. Remote server 1804 includes remote database 1830. Public cloud 1805 includes gateway 1840, cloud orchestration module 1841, host physical machine set 1842, virtual machine set 1843, and container set 1844.

Figure 14:
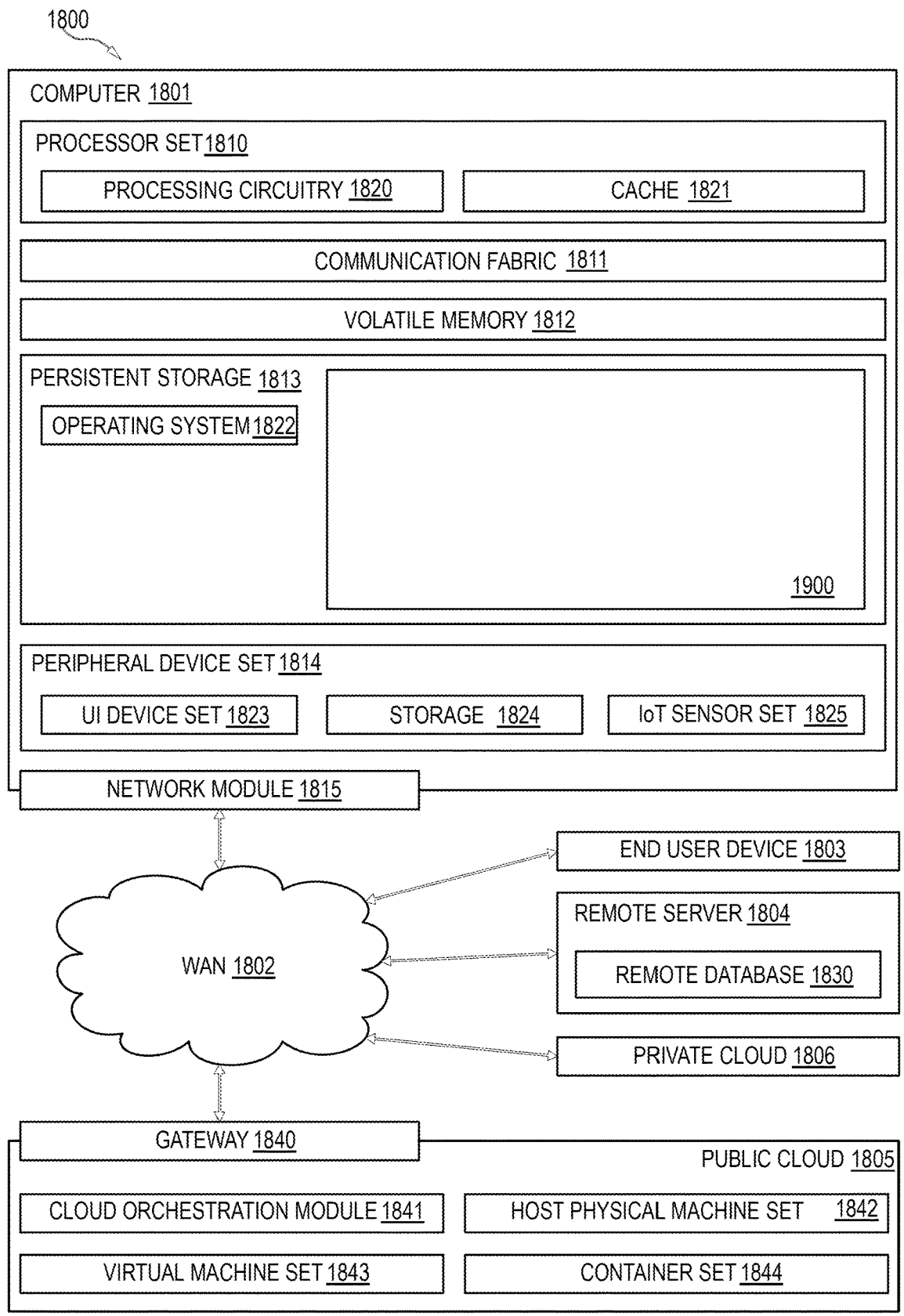
FIG. 14 is a computing environment according to an example of the present subject matter.

COMPUTER 1801 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1830. As is well understood in the art of computer technology, and depending upon the technology, performance of a computer-implemented method may be distributed among multiple computers and/or between multiple locations. On the other hand, in this presentation of computing environment 1800, detailed discussion is focused on a single computer, specifically computer 1801, to keep the presentation as simple as possible. Computer 1801 may be located in a cloud, even though it is not shown in a cloud in FIG. 14. On the other hand, computer 1801 is not required to be in a cloud except to any extent as may be affirmatively indicated.

PROCESSOR SET 1810 includes one, or more, computer processors of any type now known or to be developed in the future. Processing circuitry 1820 may be distributed over multiple packages, for example, multiple, coordinated integrated circuit chips. Processing circuitry 1820 may implement multiple processor threads and/or multiple processor cores. Cache 1821 is memory that is located in the processor chip package(s) and is typically used for data or code that should be available for rapid access by the threads or cores running on processor set 1810. Cache memories are typically organized into multiple levels depending upon relative proximity to the processing circuitry. Alternatively, some, or all, of the cache for the processor set may be located "off chip." In some computing environments, processor set 1810 may be designed for working with qubits and performing quantum computing.

Computer readable program instructions are typically loaded onto computer 1801 to cause a series of operational steps to be performed by processor set 1810 of computer 1801 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 1821 and the other storage media discussed below. The program instructions, and associated data, are accessed by processor set 1810 to control and direct performance of the inventive methods. In computing environment 1800, at least some of the instructions for performing the inventive methods may be stored in block 1900 in persistent storage 1813.

COMMUNICATION FABRIC 1811 is the signal conduction path that allows the various components of computer 1801 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 1812 is any type of volatile memory now known or to be developed in the future. Examples include dynamic type random access memory (RAM) or static type RAM. Typically, volatile memory 1812 is characterized by random access, but this is not required unless affirmatively indicated. In computer 1801, the volatile memory 1812 is located in a single package and is internal to computer 1801, but, alternatively or additionally, the volatile memory may be distributed over multiple packages and/or located externally with respect to computer 1801.

PERSISTENT STORAGE 1813 is any form of non-volatile storage for computers that is now known or to be developed in the future. The non-volatility of this storage means that the stored data is maintained regardless of whether power is being supplied to computer 1801 and/or directly to persistent storage 1813. Persistent storage 1813 may be a read only memory (ROM), but typically at least a portion of the persistent storage allows writing of data, deletion of data and re-writing of data. Some familiar forms of persistent storage include magnetic disks and solid state storage devices. Operating system 1822 may take several forms, such as various known proprietary operating systems or open source Portable Operating System Interface-type operating systems that employ a kernel. The code included in block 1900 typically includes at least some of the computer code involved in performing the inventive methods.

PERIPHERAL DEVICE SET 1814 includes the set of peripheral devices of computer 1801. Data communication connections between the peripheral devices and the other components of computer 1801 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 1823 may include components such as a display screen, speaker, microphone, wearable devices (such as goggles and smart watches), keyboard, mouse, printer, touchpad, game controllers, and haptic devices. Storage 1824 is external storage, such as an external hard drive, or insertable storage, such as an SD card. Storage 1824 may be persistent and/or volatile. In some embodiments, storage 1824 may take the form of a quantum computing storage device for storing data in the form of qubits. In embodiments where computer 1801 is required to have a large amount of storage (for example, where computer 1801 locally stores and manages a large database) then this storage may be provided by peripheral storage devices designed for storing very large amounts of data, such as a storage area network (SAN) that is shared by multiple, geographically distributed computers. IoT sensor set 1825 is made up of sensors that can be used in Internet of Things applications. For example, one sensor may be a thermometer and another sensor may be a motion detector.

NETWORK MODULE 1815 is the collection of computer software, hardware, and firmware that allows computer 1801 to communicate with other computers through WAN 1802. Network module 1815 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1815 are performed on the same physical hardware device. In other embodiments (for example, embodiments that utilize software-defined networking (SDN)), the control functions and the forwarding functions of network module 1815 are performed on physically separate devices, such that the control functions manage several different network hardware devices. Computer readable program instructions for performing the inventive methods can typically be downloaded to computer 1801 from an external computer or external storage device through a network adapter card or network interface included in network module 1815.

WAN 1802 is any wide area network (for example, the internet) capable of communicating computer data over non-local distances by any technology for communicating computer data, now known or to be developed in the future. In some embodiments, the WAN 1802 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 1803 is any computer system that is used and controlled by an end user (for example, a customer of an enterprise that operates computer 1801), and may take any of the forms discussed above in connection with computer 1801. EUD 1803 typically receives helpful and useful data from the operations of computer 1801. For example, in a hypothetical case where computer 1801 is designed to provide a recommendation to an end user, this recommendation would typically be communicated from network module 1815 of computer 1801 through WAN 1802 to EUD 1803. In this way, EUD 1803 can display, or otherwise present, the recommendation to an end user. In some embodiments, EUD 1803 may be a client device, such as thin client, heavy client, mainframe computer, desktop computer and so on.

REMOTE SERVER 1804 is any computer system that serves at least some data and/or functionality to computer 1801. Remote server 1804 may be controlled and used by the same entity that operates computer 1801. Remote server 1804 represents the machine(s) that collect and store helpful and useful data for use by other computers, such as computer 1801. For example, in a hypothetical case where computer 1801 is designed and programmed to provide a recommendation based on historical data, then this historical data may be provided to computer 1801 from remote database 1830 of remote server 1804.

PUBLIC CLOUD 1805 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1805 is performed by the computer hardware and/or software of cloud orchestration module 1841. The computing resources provided by public cloud 1805 are typically implemented by virtual computing environments that run on various computers making up the computers of host physical machine set 1842, which is the universe of physical computers in and/or available to public cloud 1805. The virtual computing environments (VCEs) typically take the form of virtual machines from virtual machine set 1843 and/or containers from container set 1844. It is understood that these VCEs may be stored as images and may be transferred among and between the various physical machine hosts, either as images or after instantiation of the VCE. Cloud orchestration module 1841 manages the transfer and storage of images, deploys new instantiations of VCEs and manages active instantiations of VCE deployments. Gateway 1840 is the collection of computer software, hardware, and firmware that allows public cloud 1805 to communicate through WAN 1802.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 1806 is similar to public cloud 1805, except that the computing resources are only available for use by a single enterprise. While private cloud 1806 is depicted as being in communication with WAN 1802, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1805 and private cloud 1806 are both part of a larger hybrid cloud.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

What is claimed is:

1. A method for compensating non-ideality of a neuromorphic memory device, the neuromorphic memory device comprising a crossbar array, the crossbar array comprising wordlines and bitlines and resistive memory elements coupled between the wordlines and the bitlines at junctions formed by the wordlines and the bitlines, the crossbar array comprising an initial block of one or more wordline segments of respective wordlines, referred to as initial wordlines, and one or more bitline segments of respective bitlines, referred to as initial bitlines, wherein the resistive memory elements of the initial block are programmed to represent array values; the device being configured for applying a set of encoding inputs to the initial wordlines for performing dot products; the method comprising:
  performing at least one of: wordline expansion or bitline expansion of the initial block resulting in an expanded block of resistive memory elements,
  the wordline expansion comprising adding to each wordline segment of the initial block one or more memory elements of the respective initial wordline resulting in an expanded wordline segment, the adding comprising programming the added memory elements to enable a predefined total conductance in the expanded worldline segment;
  the bitline expansion comprising adding to each bitline segment of the initial block one or more memory elements of the respective initial bitline resulting in an expanded bitline segment, the adding comprising programming the added memory elements to generate a predefined offset current in the expanded bitline segment;
  applying the set of encoding inputs to the initial wordlines of the expanded block and in case the bitline expansion is performed further applying an additional encoding input to the additional wordlines of the expanded block;
  measuring the currents flowing in the bitlines of the expanded block; and
  determining the dot products using the measured currents.

2. The method of claim 1, wherein the predefined total conductance in the expanded worldline segment is the same total conductance in all expanded wordline segments.

3. The method of claim 1, further comprising:
  for target conductances of a set of target conductances:
    programming all memory elements of the crossbar array to the target conductance;
    for encoding input of a set of encoding inputs,
      sweeping the encoding input to the crossbar, and measuring a wordline conductance per wordline;
      selecting one of the measured wordline conductances; resulting in a set of selected wordline conductances per target conductance of the set of conductances;
    analyzing the sets of selected wordline conductances as function of the set of voltages for determining an offset and the largest wordline conductance, the analyzing resulting in pairs of offset and largest wordline conductance; and
    wherein the predefined total conductance is the largest wordline conductance associated with a selected desired offset.

4. The method of claim 3, the desired offset being smaller than a predefined threshold.

5. The method of claim 1, further comprising: determining the one or more memory elements to be added in the wordline expansion for a given wordline segment comprising:
  determining a maximum allowed conductance to program a memory element;
  determining the conductance of the memory elements of the given wordline segment;
  using the difference between the determined conductance and the predefined total conductance as a padding conductance to be added to the given wordline segment;
  determining the number of elements to be added to the given wordline segment as the ration of the padding conductance and the maximum allowed conductance.

6. The method of claim 1, wherein measuring the currents flowing in the bitlines of the expanded block comprises subtracting the offset current from the measured currents.

7. The method of claim 6, further comprising estimating the offset current by applying the additional voltage to the additional wordlines of the expanded block without applying voltages to the remaining wordlines, and measuring the flowing currents in the bitlines of the expanded block in order to determine the offset current.

8. The method of claim 1, further comprising determining the offset current comprising:
  building a transfer current curve of the neuromorphic memory device;
  determining a current amplitude of the curve at which the second derivative of the transfer curve converges; and
  using the current amplitude for determining the offset current.

9. The method of claim 8, wherein the offset current is equal, up to a factor, to the current amplitude.

10. The method of claim 1, the crossbar array comprising an even number of the bitlines, the bitlines comprising non overlapping pairs of consecutive bitlines, wherein each pair comprises a positive bitline and corresponding negative bitline, wherein representing an array value in the crossbar comprises: selecting a pair of the pairs that corresponds to a position of the array value in the array, in case the array value is negative, programming the corresponding memory element of the negative bitline of the selected pair to represent the array value, in case the array value is positive, programming the corresponding positive memory element of the negative bitline of the selected pair to represent the array value.

11. The method of claim 10, wherein the additional memory elements are added as positive memory elements to the respective positive bitline segment.

12. The method of claim 10, wherein the additional memory elements are added as negative memory elements to the respective negative bitline segment.

13. The method of claim 10, wherein the additional memory elements are added as positive memory elements to the respective positive bitline segment and as negative memory elements to the respective negative bitline segment, wherein the additional memory elements are programmed to a same conductance.

14. The method of claim 11, wherein the additional voltage is used as a positive value for half of the additional wordlines of the expander block and used as a negative value for the other half, wherein the additional memory elements are programmed to a same conductance.

15. The method of claim 12, wherein the additional voltage is used as a positive value for half of the additional wordlines of the expander block and used as a negative value for the other half, wherein the additional memory elements are programmed to a same conductance.

16. The method of claim 11, further comprising estimating the offset current by applying the additional voltage to the additional wordlines of the expanded block without applying voltages to the remaining wordlines, and measuring the flowing currents in the bitlines of the expanded block in order to determine the offset current; and subtracting the offset current from the measured currents.

17. The method of claim 11, further comprising estimating the offset current by applying the additional voltage to the additional wordlines of the expanded block without applying voltages to the remaining wordlines, and measuring the flowing currents in the bitlines of the expanded block in order to determine the offset current; and subtracting the offset current from the measured currents.

18. The method of claim 1, the encoding inputs being defined by respective durations of a pulse having a fixed amplitude, or defined by respective amplitudes of a pulse having a fixed duration.

19. A computer program product for compensating non-ideality of a neuromorphic memory device, the neuromorphic memory device comprising a crossbar array, the crossbar array comprising wordlines and bitlines and resistive memory elements coupled between the wordlines and the bitlines at junctions formed by the wordlines and the bitlines, the crossbar array comprising an initial block of one or more wordline segments of respective wordlines, referred to as initial wordlines, and one or more bitline segments of respective bitlines, referred to as initial bitlines, wherein the resistive memory elements of the initial block are programmed to represent array values; the device being configured for applying a set of encoding inputs to the initial wordlines for performing dot products, the computer program product comprising a non-transitory tangible storage device having computer-readable program code embodied therewith, the computer-readable program code executable by a processor of a computer to perform a method, the method comprising:

performing at least one of: wordline expansion or bitline expansion of the initial block resulting in an expanded block of resistive memory elements, the wordline expansion comprising adding to each wordline segment of the initial block one or more memory elements of the respective initial wordline resulting in an expanded wordline segment, the adding comprising programming the added memory elements to enable a predefined total conductance in the expanded worldline segment;

the bitline expansion comprising adding to each bitline segment of the initial block one or more memory elements of the respective initial bitline resulting in an expanded bitline segment, the adding comprising programming the added memory elements to generate a predefined offset current in the expanded bitline segment;

applying the set of encoding inputs to the initial wordlines of the expanded block and in case the bitline expansion is performed further applying an additional encoding input to the additional wordlines of the expanded block;

measuring the currents flowing in the bitlines of the expanded block; and determining the dot products using the measured currents.

20. A computer system for compensating non-ideality of a neuromorphic memory device, the neuromorphic memory device comprising a crossbar array, the crossbar array comprising wordlines and bitlines and resistive memory elements coupled between the wordlines and the bitlines at junctions formed by the wordlines and the bitlines, the crossbar array comprising an initial block of one or more wordline segments of respective wordlines, referred to as initial wordlines, and one or more bitline segments of respective bitlines, referred to as initial bitlines, wherein the resistive memory elements of the initial block are programmed to represent array values; the device being configured for applying a set of encoding inputs to the initial wordlines for performing dot products, the computer system comprising:

one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:

performing at least one of: wordline expansion or bitline expansion of the initial block resulting in an expanded block of resistive memory elements, the wordline expansion comprising adding to each wordline segment of the initial block one or more memory elements of the respective initial wordline resulting in an expanded wordline segment, the adding comprising programming the added memory elements to enable a predefined total conductance in the expanded worldline segment;

the bitline expansion comprising adding to each bitline segment of the initial block one or more memory elements of the respective initial bitline resulting in an expanded bitline segment, the adding comprising programming the added memory elements to generate a predefined offset current in the expanded bitline segment;

applying the set of encoding inputs to the initial wordlines of the expanded block and in case the bitline expansion is performed further applying an additional encoding input to the additional wordlines of the expanded block;

measuring the currents flowing in the bitlines of the expanded block; and determining the dot products using the measured currents.

* * * * *